(12) United States Patent
Uchiyama et al.

(10) Patent No.: US 7,112,870 B2
(45) Date of Patent: *Sep. 26, 2006

(54) SEMICONDUCTOR INTEGRATED CIRCUIT DEVICE INCLUDING DUMMY PATTERNS LOCATED TO REDUCE DISHING

(75) Inventors: Hiroyuki Uchiyama, Tachikawa (JP); Hiraku Chakihara, Akishima (JP); Teruhisa Ichise, Ome (JP); Michimoto Kaminaga, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/028,208

(22) Filed: Jan. 4, 2005

(65) Prior Publication Data

US 2005/0110065 A1 May 26, 2005

Related U.S. Application Data

(60) Division of application No. 10/405,615, filed on Apr. 3, 2003, now Pat. No. 7,009,233, which is a continuation of application No. 09/692,450, filed on Oct. 20, 2000, now Pat. No. 6,603,162.

(30) Foreign Application Priority Data

Dec. 3, 1999 (JP) .................. 11-345429

(51) Int. Cl.
*H01L 29/00* (2006.01)
*H01L 39/00* (2006.01)
*H01L 29/40* (2006.01)
*H01L 23/495* (2006.01)
*H01L 23/06* (2006.01)

(52) U.S. Cl. ................... 257/662; 257/663; 257/664; 257/666; 257/684; 257/531

(58) Field of Classification Search ........ 257/530–535, 257/381, 758, 390–391, 295–310, 662–666, 257/684

See application file for complete search history.

(56) References Cited

U.S. PATENT DOCUMENTS 5,292,689 A 3/1994 Cronin et al.
5,308,682 A 5/1994 Morikawa
5,321,304 A 6/1994 Rostoker (Continued)

FOREIGN PATENT DOCUMENTS

JP 5275527 10/1993

(Continued)

OTHER PUBLICATIONS

Lee, et al., "An Optimized Densification of the Filled Oxide for Quarter Micron Shallow Trench Isolation (STI)", 1996, Symposium on VLSI Technology Digest of Technical Papers, pp. 158-159.

*Primary Examiner*—Cuong Nguyen
(74) *Attorney, Agent, or Firm*—Antonelli, Terry, Stout and Kraus, LLP.

(57) ABSTRACT

A large area dummy pattern DL is formed in a layer underneath a target T2 region formed in a scribe region SR of a wafer. A small area dummy pattern in a lower layer and a small area dummy pattern Ds2 in an upper layer are disposed in a region where the inter-pattern space of a pattern (active regions L1, L2, L3, gate electrode 17), which functions as an element of a product region PR and scribe region SR, is wide. The small area dummy pattern Ds2 in the upper layer is offset by ½ pitch relative to the small area dummy pattern Ds in the lower layer.

144 Claims, 28 Drawing Sheets

U.S. PATENT DOCUMENTS

| | | |
|---|---|---|
| 5,441,915 A | 8/1995 | Lee |
| 5,459,093 A | 10/1995 | Kuroda |
| 5,498,565 A | 3/1996 | Gocho et al. |
| 5,614,445 A | 3/1997 | Hirabayashi |
| 5,621,241 A | 4/1997 | Jain |
| 5,885,856 A | 3/1999 | Gilbert |
| 5,892,277 A | 4/1999 | Ikemizu et al. |
| 5,929,528 A | 7/1999 | Kinugawa |
| 6,020,616 A | 2/2000 | Bothra et al. |
| 6,077,784 A | 6/2000 | Wu |
| 6,087,733 A | 7/2000 | Maxim et al. |
| 6,130,139 A | 10/2000 | Ukeda et al. |
| 6,171,976 B1 | 1/2001 | Cheng |
| 6,255,697 B1 | 7/2001 | Yoo et al. |
| 6,261,883 B1 | 7/2001 | Koubuchi et al. |
| 6,326,278 B1 | 12/2001 | Komuro |
| 6,346,736 B1 | 2/2002 | Ukeda et al. |
| 6,433,438 B1 | 8/2002 | Koubuchi et al. |
| 6,664,642 B1 | 12/2003 | Koubuchi et al. |
| 6,693,315 B1 | 2/2004 | Kuroda et al. |

FOREIGN PATENT DOCUMENTS

| | | |
|---|---|---|
| JP | 7-74175 | 3/1995 |
| JP | 07-092838 | 4/1995 |
| JP | 8314762 | 11/1996 |
| JP | 923844 | 6/1997 |
| JP | 9181159 | 7/1997 |
| JP | 10-335333 | 12/1998 |
| JP | 410335333 | 12/1998 |
| JP | 11-233411 | 8/1999 |
| WO | 9615552 | 5/1996 |

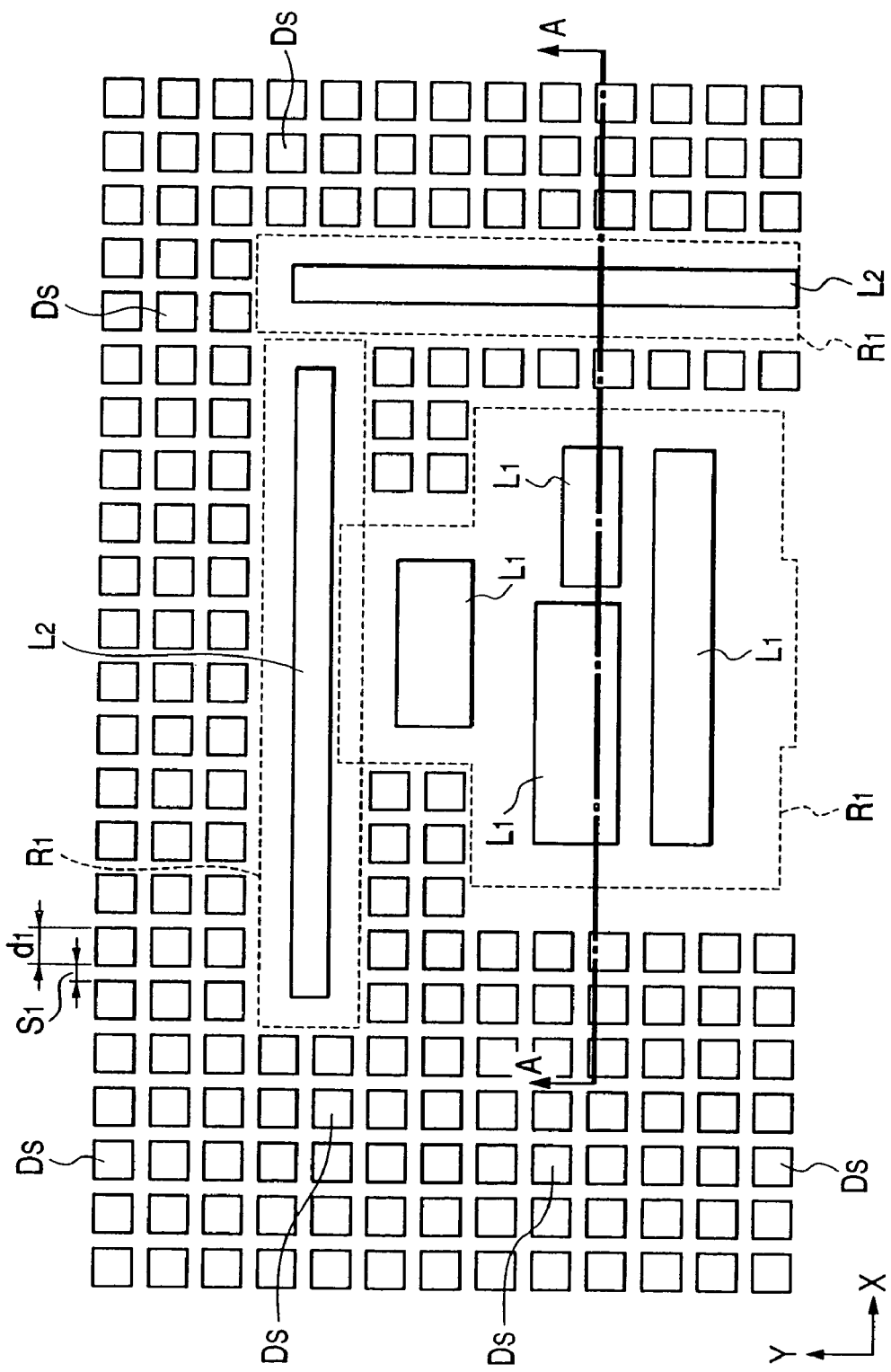

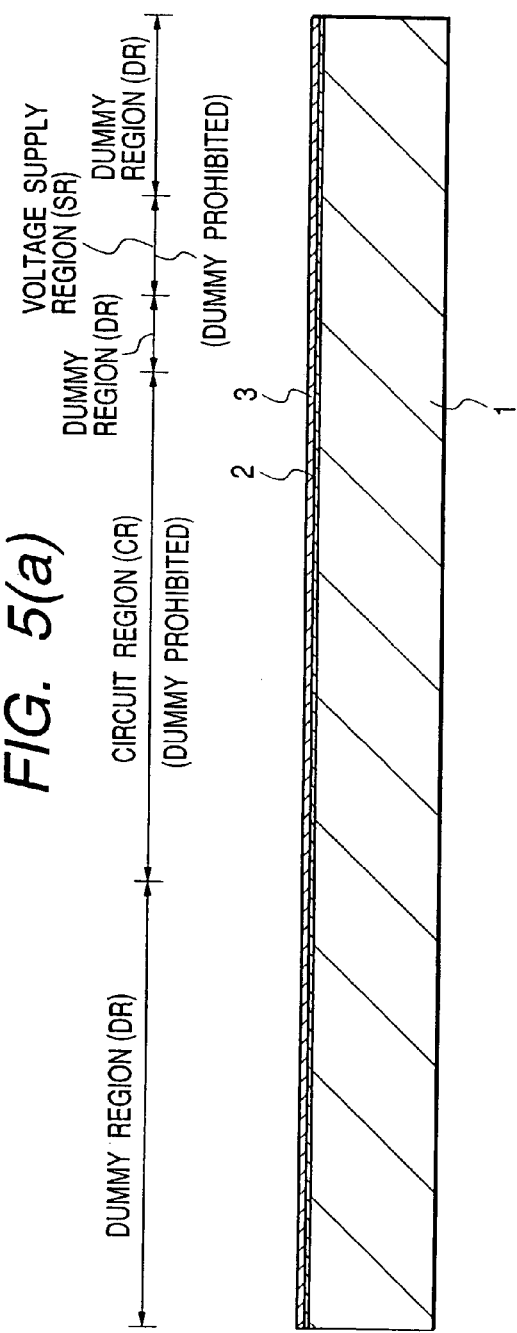
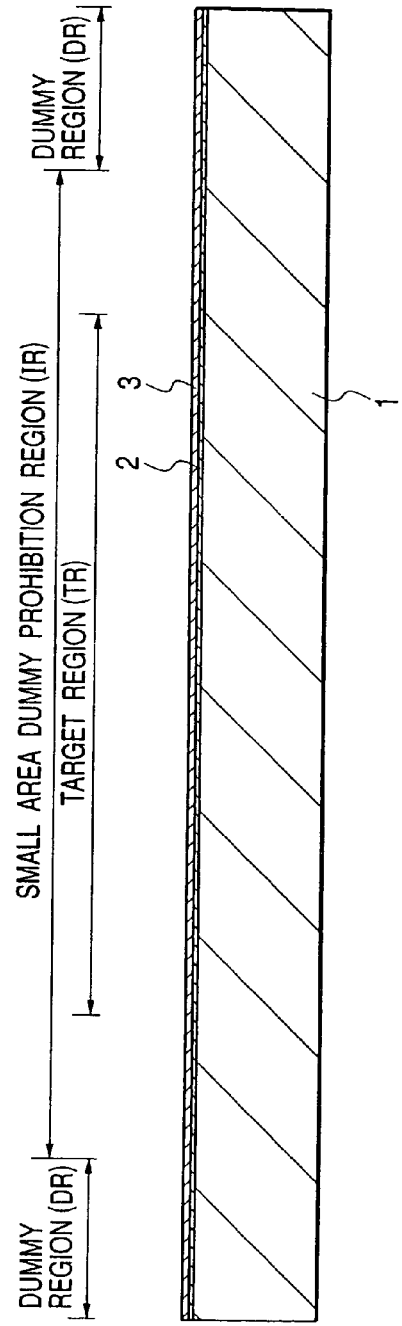
FIG. 5(a)
FIG. 5(b)

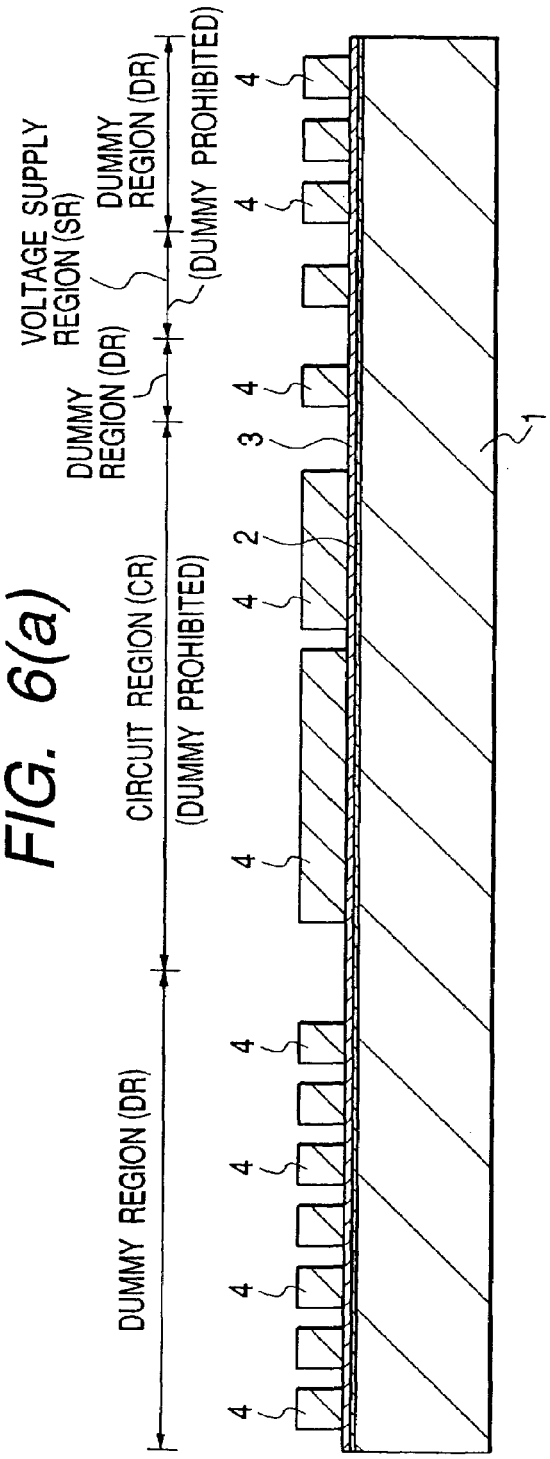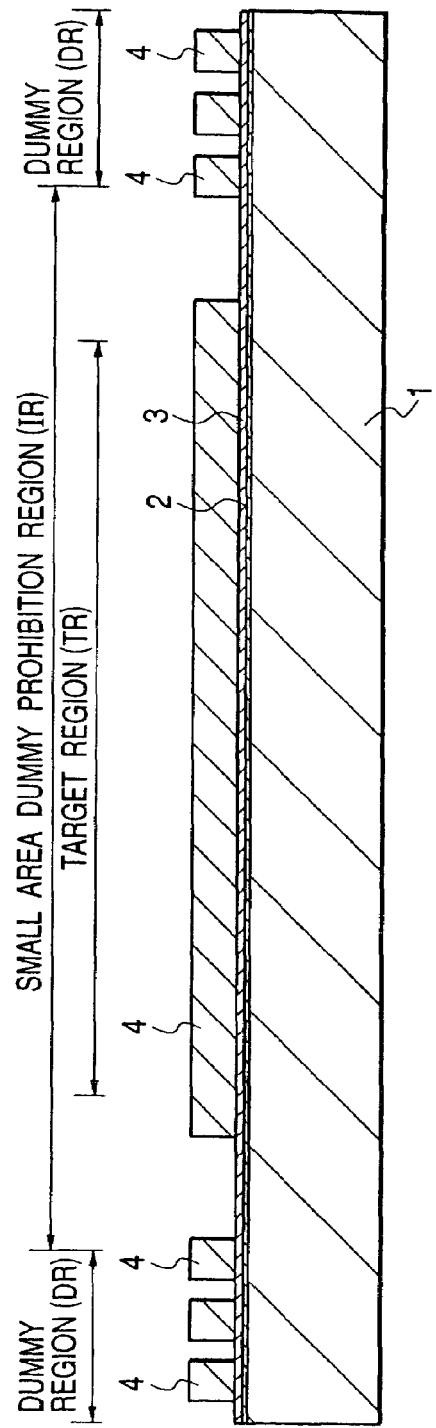

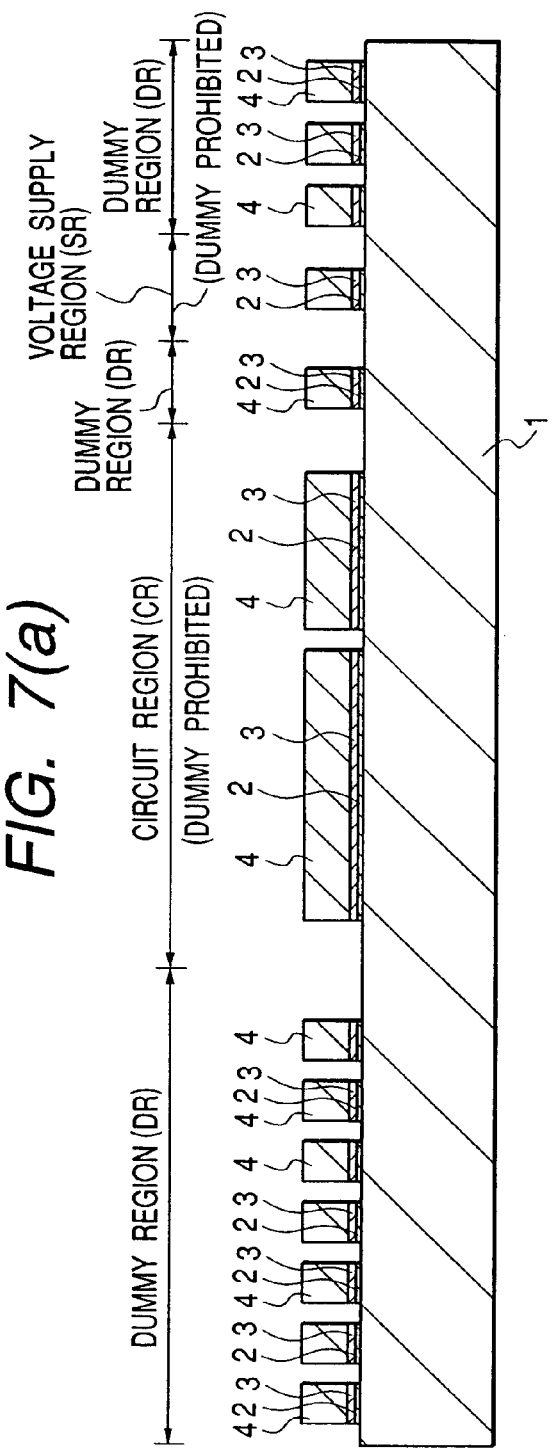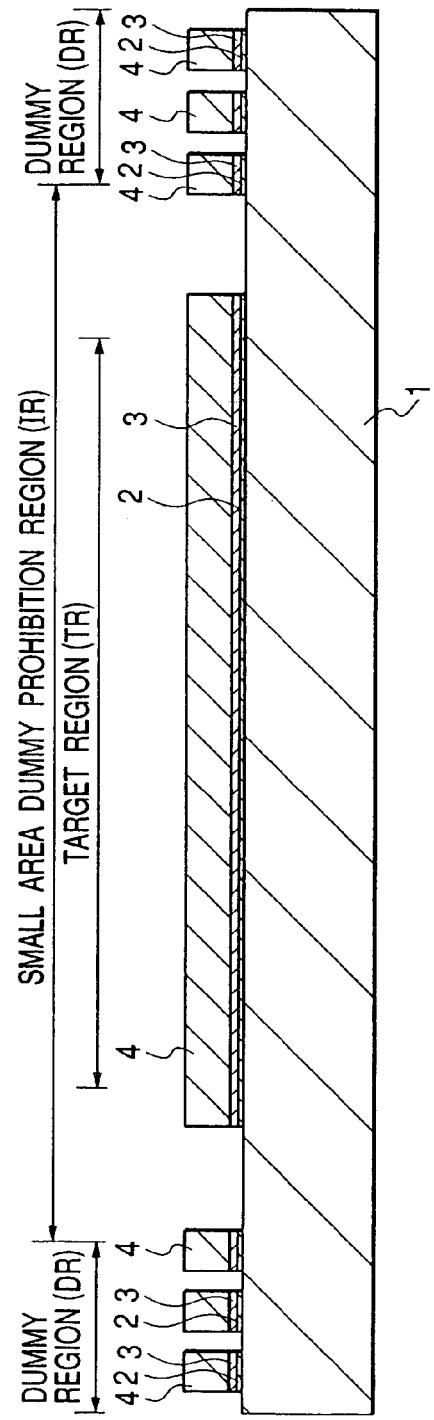

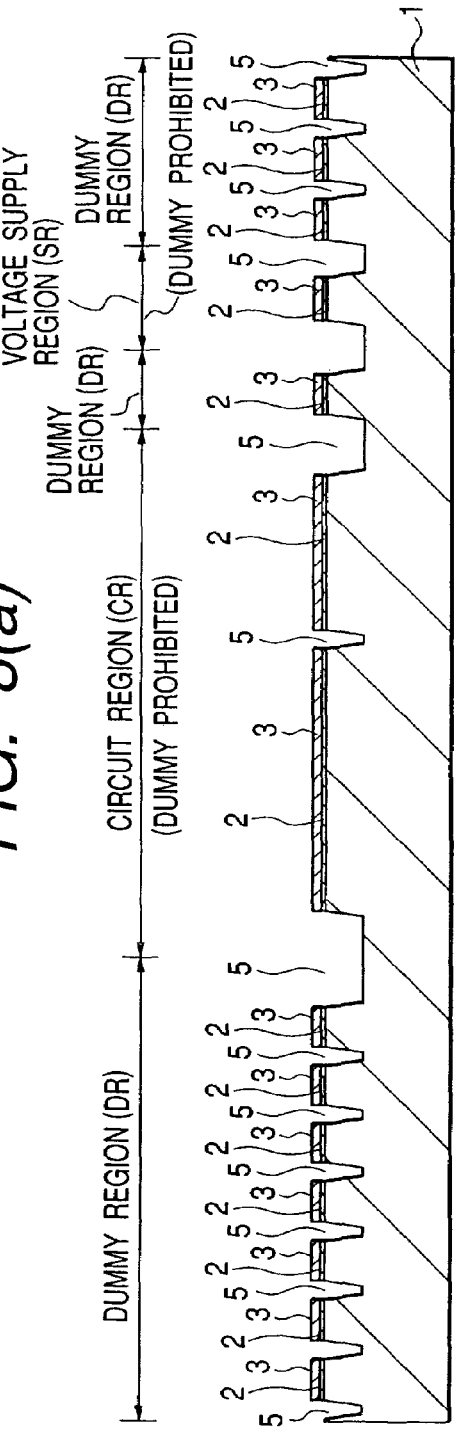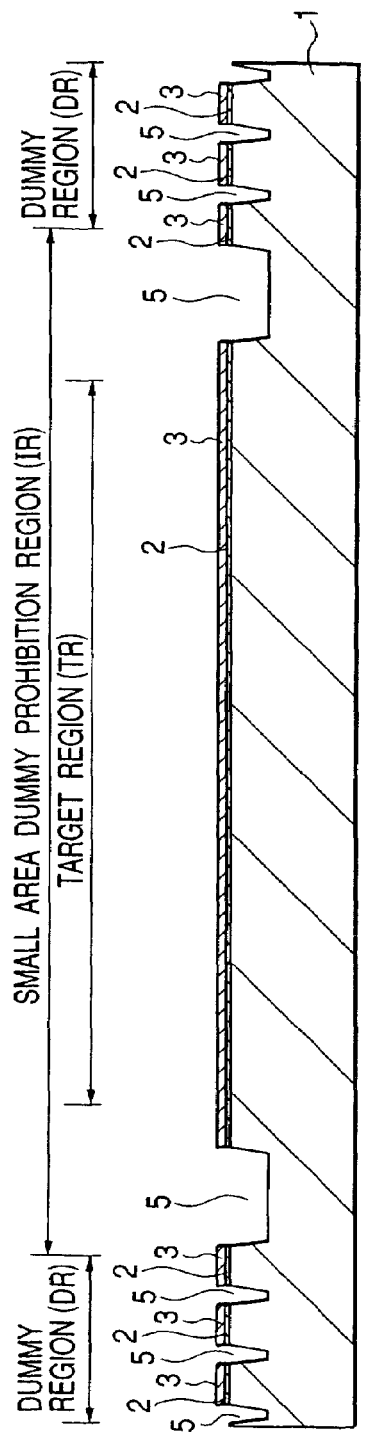

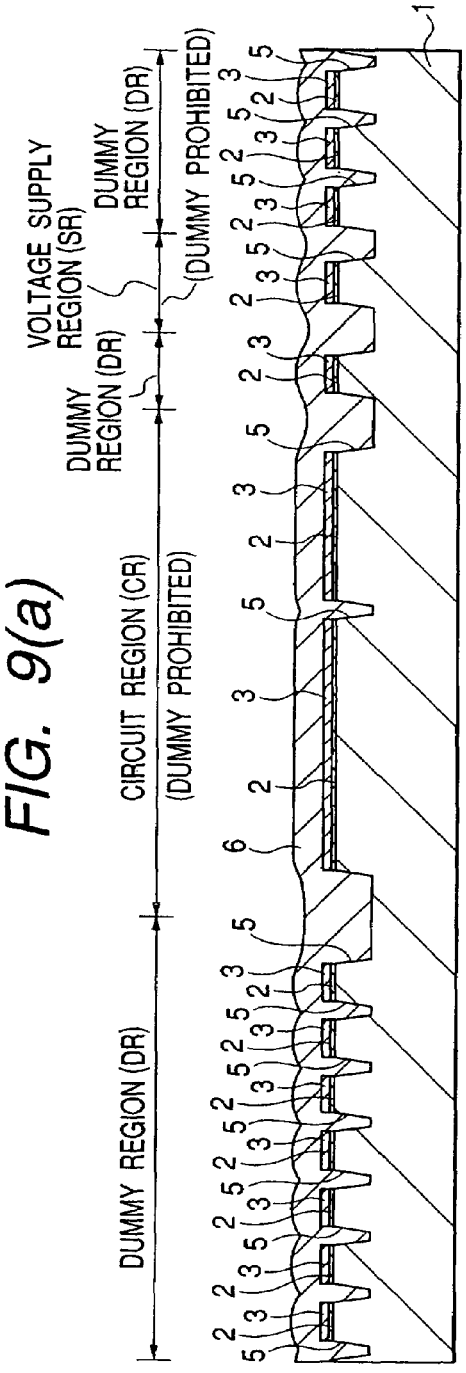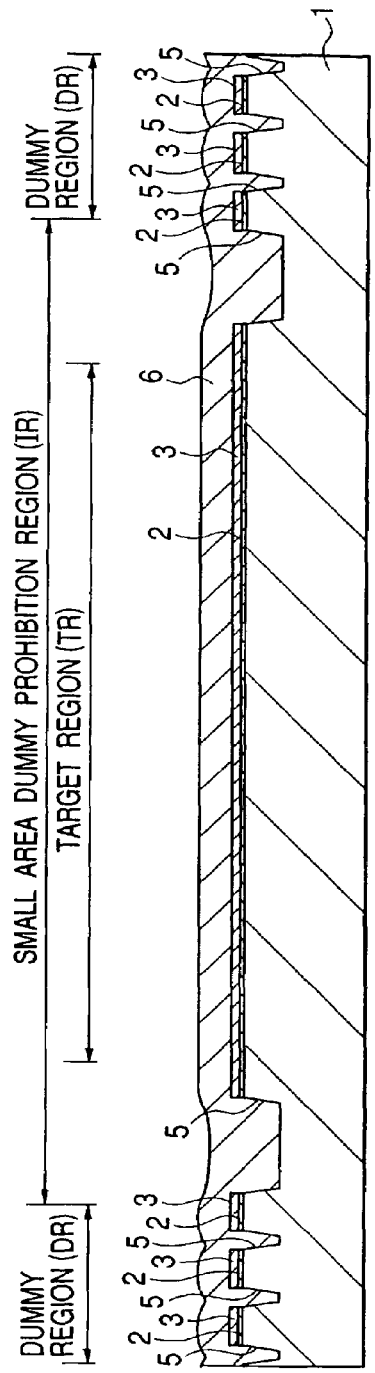

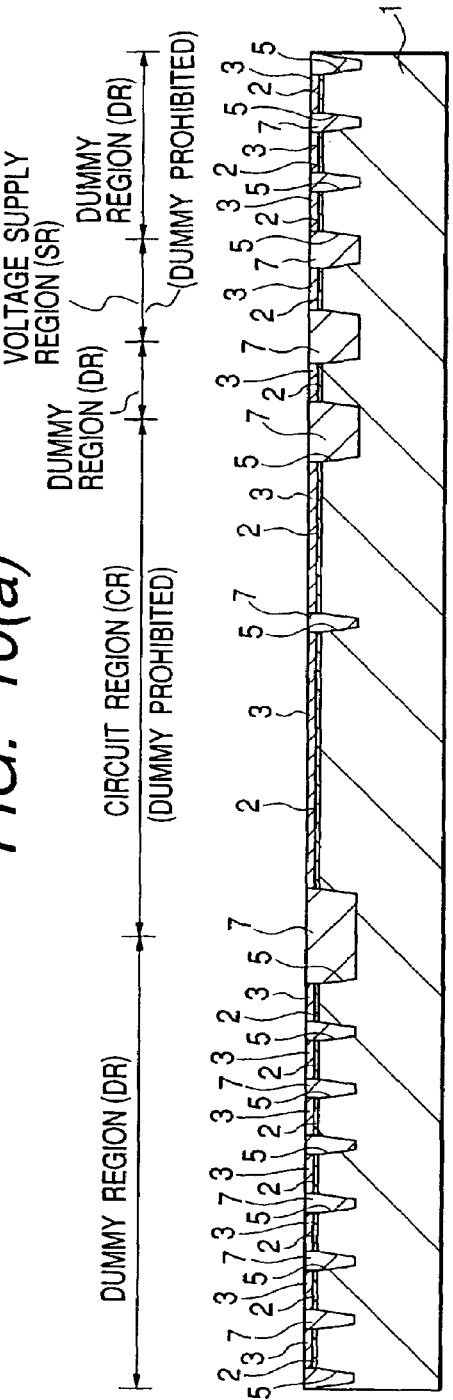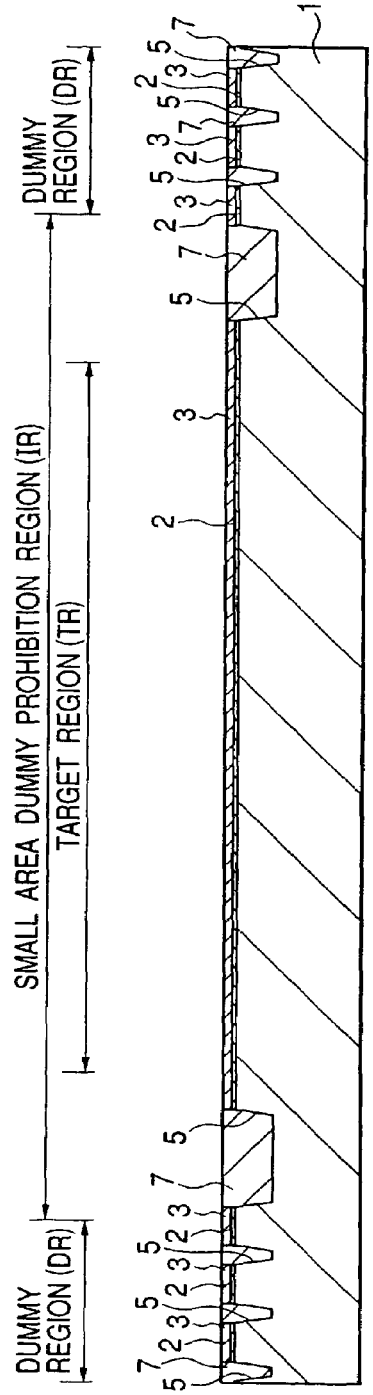

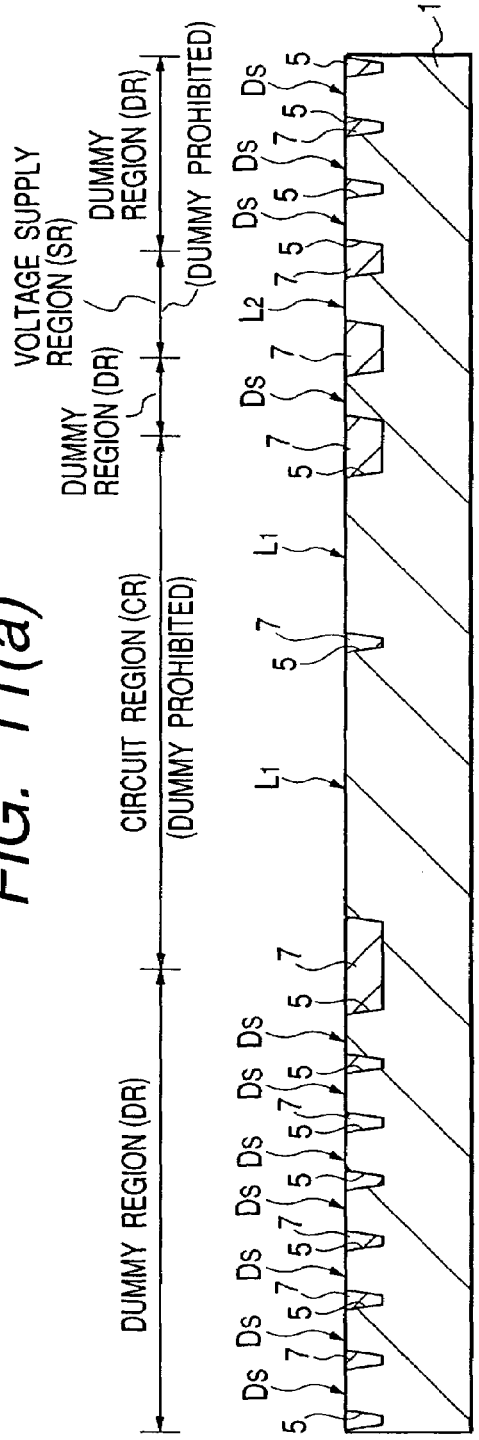
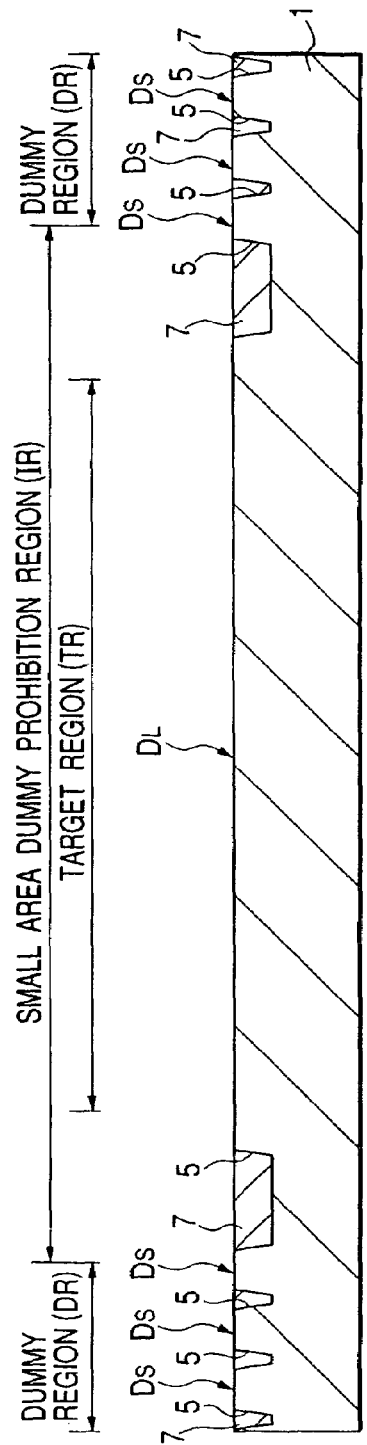
FIG. 11(a)
FIG. 11(b)

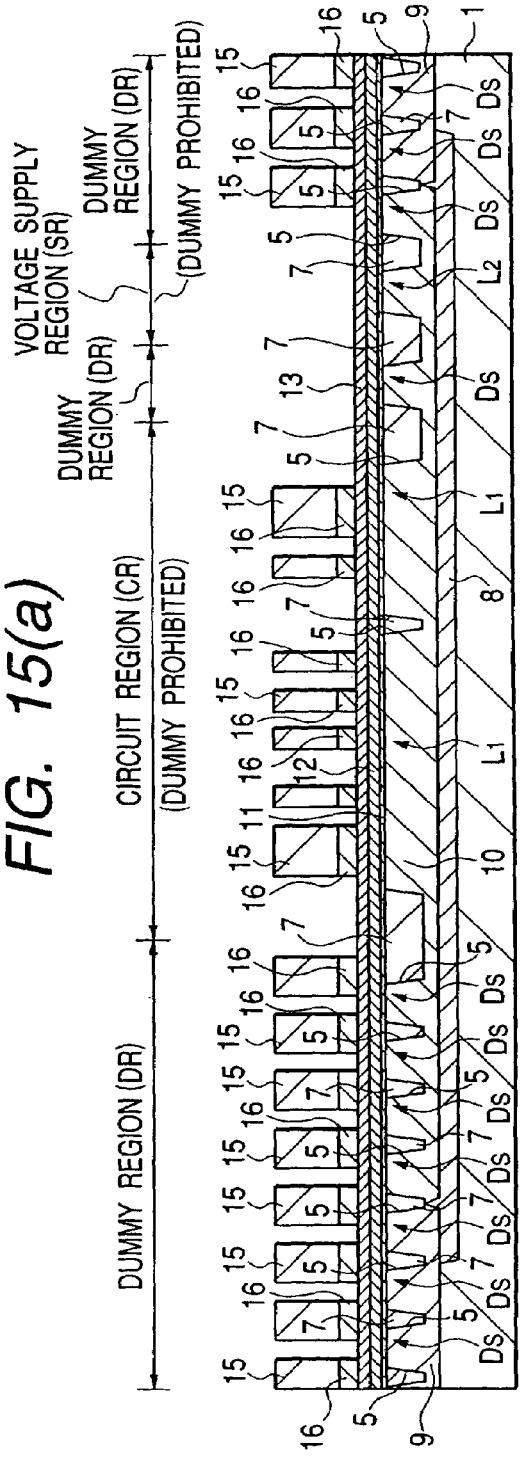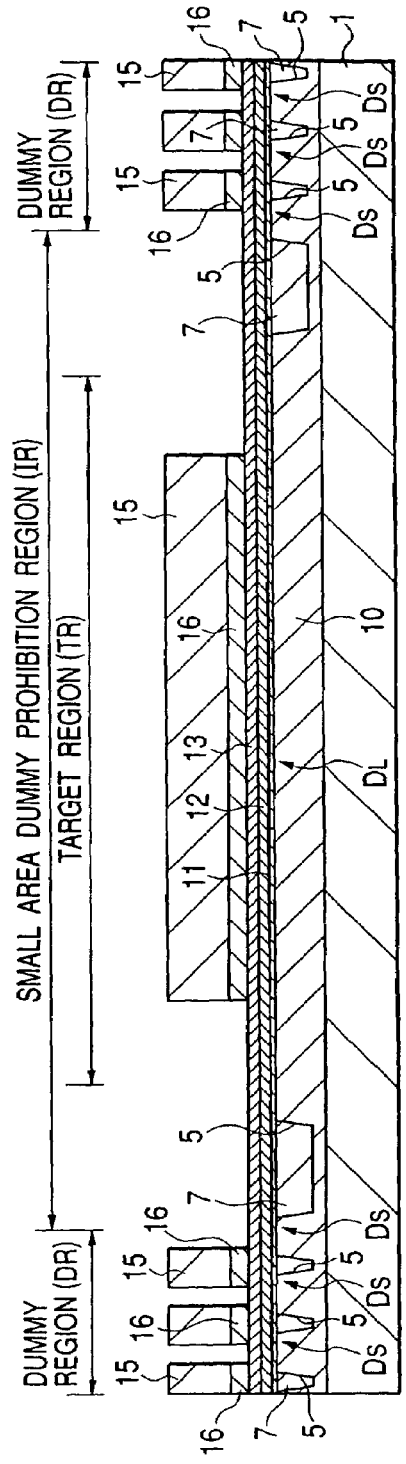

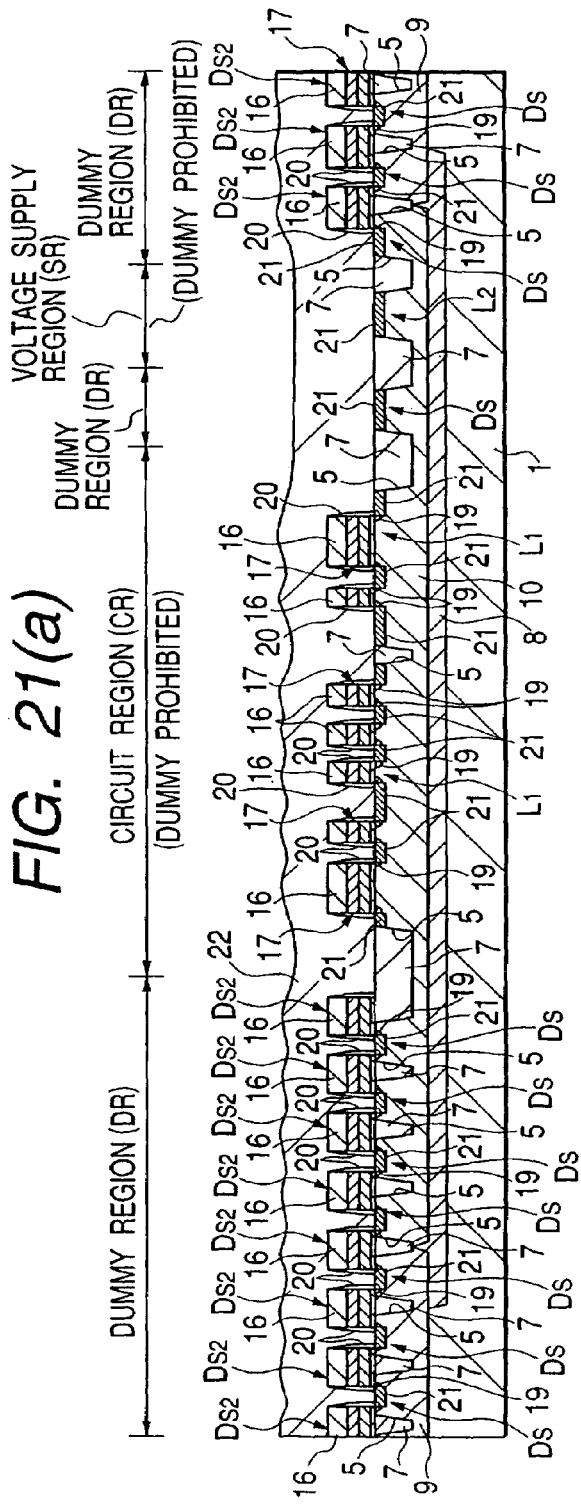
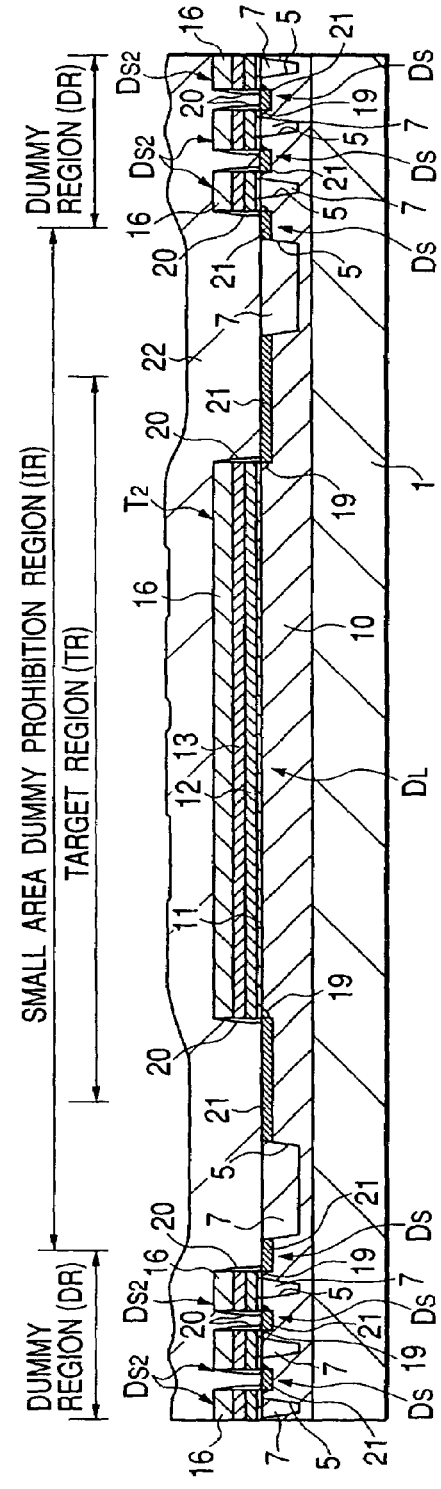
FIG. 21(a)
FIG. 21(b)

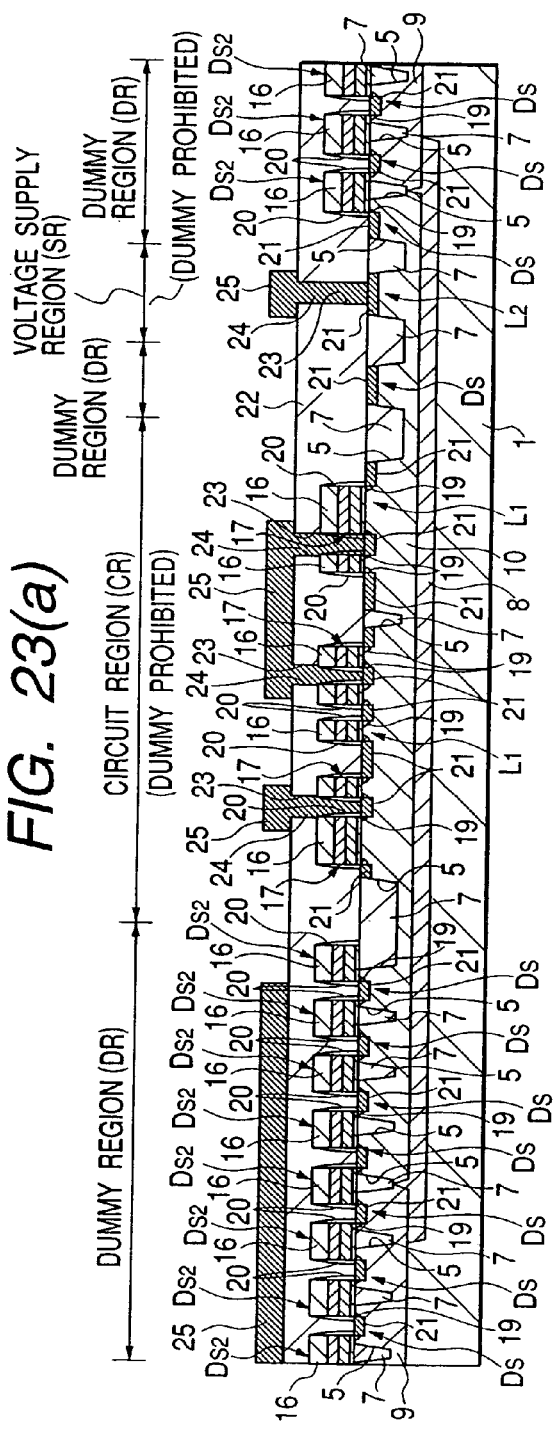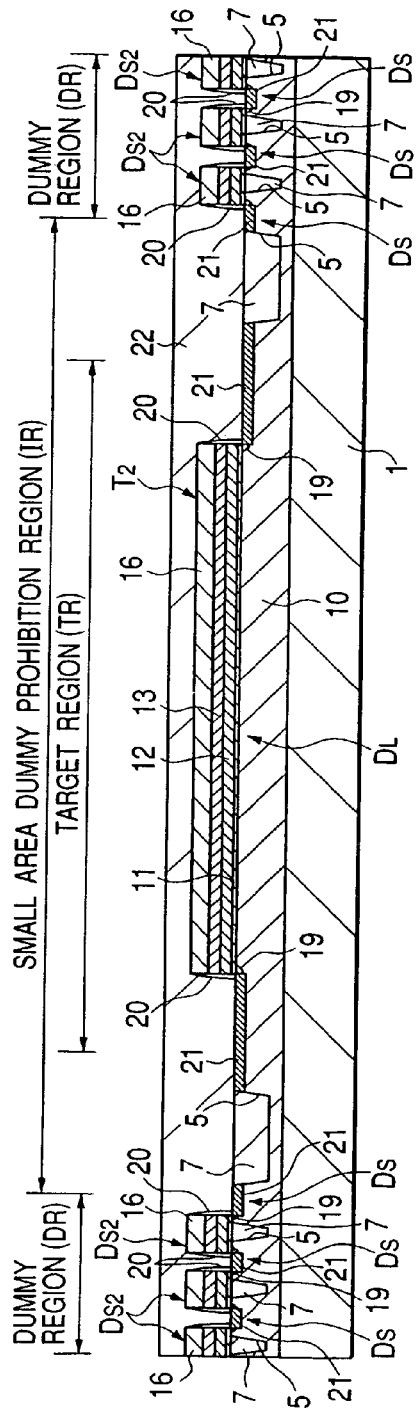

SEMICONDUCTOR INTEGRATED CIRCUIT DEVICE INCLUDING DUMMY PATTERNS LOCATED TO REDUCE DISHING

CROSS REFERENCE TO RELATED APPLICATION

This application is a Divisional of application Ser. No. 10/405,615, filed Apr. 3, 2003 now U.S. Pat No. 7,009,233, which is a Continuation of application Ser. No. 09/692,450, filed Oct. 20, 2000 (now U.S. Pat No. 6,603,162), the entire disclosures of which are incorporated herein by reference.

BACKGROUND OF THE INVENTION

This invention relates to a semiconductor integrated circuit device and to a process for manufacturing the same; and, in particular, the invention relates to a process which can effectively be applied to a semiconductor integrated circuit device comprising a step for flattening a surface using CMP (Chemical Mechanical Polishing).

In semiconductor integrated circuit devices, such as a DRAM (Dynamic Random Access Memory), demand has been increasing in recent years for finer detail and a higher degree of integration. Due to the demand for greater detail in semiconductor integrated circuit devices, laminated structures in multilayer interconnections are unavoidable, but if a multilayer structure is used, imperfections are formed on the surface of the upper layer reflecting the imperfections in the substrate. If photolithography is performed when imperfections are present on the surface, sufficient tolerance of focal depth cannot be obtained in the exposure step, and this leads to poor resolution. Therefore, the surface is flattened using CMP in order to improve the photolithography of components formed on the surface.

The CMP technique is used also to form isolation regions. In the LOCOS (Local Oxidation of Silicon) technique, which was frequenT1y used in the past, it is difficult to achieve more than a certain amount of detail due to the presence of a bird's beak. Thus, a shallow groove is formed on a main surface of the semiconductor substrate; this groove is filled with a silicon oxide film; and the silicon oxide in the regions outside the groove are removed by CMP to form a shallow groove isolation. With a shallow groove isolation, the periphery of the isolation region is sharply defined, so the periphery can also be used effectively as an element part, so that it is easier to achieve finer detail.

However, when the CMP technique is used for polishing, it is impossible to completely remove surface imperfections. When there are imperfections on the polishing surface, a history of imperfections remains on the polishing surface to some extent. Further, if parts which are easily polished and parts which are difficult to polish are both present on the polishing surface, dishing (polishing depressions) tends to occur in the part which is easy to polish. Due to the nature of polishing in the CMP method, this history of imperfections or dishing is particularly significant when the imperfections or parts which are easy to polish have a large area. Specifically, in polishing by the CMP method, although small imperfections can be flattened relatively well, undulations (global undulations) remain over a large area when a large pattern (usually of the order of several µm or more) is repeated, for example, and so it is difficult to flatten the surface completely.

However, a method has been proposed where a dummy pattern is disposed in regions where there are large patterns or where there is a wide pattern interval. In this method, the pattern interval is decreased due to the dummy pattern, so that the aforesaid wide area (global) dishing or undulations are suppressed. For example, in Japanese Unexamined Patent Publication No. Hei 10-335333 (1998) (Koho) (U.S. Ser. No. 09/050416, 31 Mar. 1998), a technique is disclosed wherein a dummy pattern is disposed in a region with a wide pattern interval to improve the flatness of the surface of an insulating film which fills the pattern.

SUMMARY OF THE INVENTION

By disposing a dummy pattern in a region where there is a large distance between patterns, so as to decrease the pattern interval, it is possible to deal with the problem of dishing (depressions) or undulations over a wide area. In dishing, the larger the area is the lower the position of the depression in the central part is; and, therefore, by disposing the dummy pattern so as to decrease the area over which dishing occurs, the depth of the depression can be relatively decreased.

Nevertheless, no matter how small the pattern interval is made, dishing cannot be completely eliminated. When the problem surface to be flattened is a single layer, the depression amount is largely improved compared with the dishing which occurs in large area parts, but when the layer to be flattened is a laminate of plural layers, dishing components (depressions) are superimposed due to the positioning of the pattern, and a large amount of dishing occurs in the upper layer. In such a case, there is a decreased tolerance in the focal depth when photolithography is performed on the upper layer in a photolithography step, the overetching amount in an etching step increases, and the yield decreases.

In regions, such as scribe regions, in which elements which become products are not normally formed, a target is formed for an exposure device (such as a stepper or the like) which is used in photolithography. A dummy pattern cannot be disposed on the periphery of this target as it is necessary to recognize the pattern. The area of the target is normally of the order of several µm or more. Therefore, if a dummy pattern is not disposed in this large (large area) pattern region, dishing occurs as described above. In the prior art, as this large area pattern was formed in a scribe region and not in a product region, this was not considered to be a problem. However, the dishing in the scribe region also affects the product region, and since the tolerance of focal depth in the exposure step is becoming more critical due to the trend towards higher detail, the decreased flatness of the product region (in particular the periphery) is a matter of concern.

It is therefore an object of this invention to suppress dishing on a surface to be flattened comprising a laminate of plural layers.

It is another object of this invention to improve surface flattening in a pattern region having a large area for optical position detection such as a target.

It is still another object of this invention to improve a surface to be flattened comprising plural layers, or the flattening of a pattern of large area such as a target, thereby improving the patterning margin in a photolithography step and etching step.

The aforesaid and other objects of this invention and novel features thereof will become apparent from the following description and appended drawings.

Of the inventive features disclosed in the present application, the most typical can simply be summarized as follows.

A semiconductor integrated circuit device according to this invention comprises a semiconductor substrate having a semiconductor element formed on a main surface, a first pattern comprising a dummy pattern formed on the main surface or on one of the layers on the main surface, and a second pattern formed on an upper layer of the first pattern and comprising a pattern which serves as a target for optical pattern recognition, the pattern which serves as a target for optical pattern recognition being enclosed within the flat shape of the dummy pattern. According to this semiconductor integrated circuit device, the dummy pattern is disposed underneath the pattern used for optical pattern recognition, so that a decrease of the overall flatness in this pattern region is suppressed.

The first pattern may contain another dummy pattern having a smaller area than the dummy pattern. The dummy pattern and another dummy pattern may also be formed in a scribe region. Further, other dummy patterns may be formed in a product region and a scribe region.

The dummy pattern is formed with an area equal to or greater, than a pattern prohibition region on the periphery of the pattern used for optical pattern recognition. Therefore, a decrease in the recognition rate of optical pattern recognition of this pattern is prevented.

The first pattern has patterning dimensions of the same order as the design rule of the semiconductor elements and contains another dummy pattern having a smaller area than the dummy pattern, but the other dummy pattern is not disposed in the pattern prohibition region. In this way, by disposing a small area dummy pattern, except in the vicinity of the pattern used for optical pattern recognition, the flatness of these regions is improved, and by prohibiting provision of the small area dummy pattern in the vicinity of this pattern, a decrease in the recognition rate of the pattern used for optical pattern recognition is prevented.

The dummy pattern is formed in the scribe region of the semiconductor wafer, and the other dummy pattern is formed in the product region and scribe region of the semiconductor wafer. Hence, the flatness of the scribe region, as well as that of the product region, is improved, and the flatness in the vicinity of the boundary of the product region and scribe region is improved. This contributes to improvement of the product yield.

The semiconductor integrated circuit device according to this invention comprises a semiconductor substrate having a semiconductor element formed on its main surface, a first pattern formed on the main surface or on one of the layers on the main surface, and a second pattern formed on an upper layer of the first pattern. The first pattern comprises a first dummy pattern, the second pattern comprises a second dummy pattern having a pattern pitch and pattern width of identical design dimensions to those of the first dummy pattern, and the second dummy pattern is formed over a space of the first dummy pattern in its flat position. One of the side edges of the second dummy pattern is formed so as to overlap with the first dummy pattern in its flat surface position, or the first dummy pattern and second dummy pattern are offset by a distance of ½ pitch in its flat surface position. In such a semiconductor integrated circuit device, dishing does occur in the pattern interval between first small area dummy patterns, but the second small area dummy pattern is formed in the upper layer of the part where this dishing occurs, so that overlapping with the dishing formed between the second small area patterns is prevented. As a result, overlapping of dishing between upper and lower layers is suppressed, and flatness is improved.

In this semiconductor integrated circuit device, the first pattern may further comprise another dummy pattern having a larger area than that of the first dummy pattern, the second pattern may further comprise a pattern used for optical pattern recognition, and the pattern used for optical pattern recognition may be enclosed within the flat shape of the other dummy pattern. The other dummy pattern is formed with an area equal to or greater than the area of the pattern prohibition region on the periphery of the pattern used for optical pattern recognition, and the first dummy pattern is not disposed in the pattern prohibition region. The other dummy pattern may also be formed in the scribe region of the semiconductor wafer, and the first and second dummy patterns may also be formed in the product region and scribe region of the semiconductor wafer.

In all of the aforesaid semiconductor integrated circuit devices, the first pattern may be an active region pattern formed on the main surface, and the second pattern may be a pattern formed in the same layer as that of the gate electrode forming the semiconductor elements.

The method of manufacturing the semiconductor integrated circuit device of this invention comprises (a) a step of forming a first pattern comprising a dummy pattern on the main surface or on any component surface on the main surface of a semiconductor substrate, (b) a step of depositing an insulating film on the main surface on which the first pattern is formed or on a component patterned on the first pattern, and flattening the surface by polishing the insulating film, and (c) a step of forming a second pattern comprising a pattern used for optical pattern recognition on the upper layer of the flattened surface. The pattern used for optical pattern recognition is enclosed within the flat shape of the dummy pattern.

In this manufacturing method, a step may further be provided for detecting the pattern used for optical pattern recognition to perform alignment of the semiconductor substrate.

Alternatively, the method of manufacturing the semiconductor integrated circuit device of this invention further comprises (a) a step of forming a first pattern comprising a dummy pattern on the main surface or on any component surface on the main surface of the semiconductor substrate, (b) a step of forming a second pattern comprising a pattern used for optical pattern recognition on the upper layer of the first pattern, and (c) a step of detecting the pattern used for optical pattern recognition to perform alignment of the semiconductor substrate. The pattern used for optical pattern recognition is enclosed within the flat shape of the dummy pattern.

In either of the manufacturing methods described above, the dummy pattern may be formed with an area equal to or greater than the pattern prohibition region on the periphery of the pattern used for optical pattern recognition.

The first pattern further comprises a first dummy pattern, and the second pattern further comprises a second dummy pattern having a pattern pitch and pattern width identical to the design dimensions of the first dummy pattern, the second dummy pattern being formed over a space of the first dummy pattern in its flat surface position.

One of the side edges of the second dummy pattern is formed so as to overlap with the first dummy pattern, or the first dummy pattern and second dummy pattern are offset at a distance of ½ pitch in its flat surface position.

The dummy patterns may be formed in the scribe region of the semiconductor wafer, and the first and second dummy patterns may be formed in the product region and scribe region of the semiconductor wafer.

The component to which the first pattern is transferred is the semiconductor substrate, and the component to which the second pattern is transferred is the gate electrode.

The aforesaid semiconductor integrated circuit device can be manufactured by these semiconductor integrated circuit device manufacturing methods.

BRIEF DESCRIPTION OF THE DRAWINGS

FIG. 4 is a plan view showing an enlargement of a product region of the chip.

FIG. 5(a) and FIG. 5(b) are sectional views showing an example of a method of manufacturing the semiconductor integrated circuit device according to the embodiment as a sequence of processes.

FIG. 6(a) and FIG. 6(b) are sectional views showing an example of a method of manufacturing the semiconductor integrated circuit device according to the embodiment as a sequence of processes.

FIG. 7(a) and FIG. 7(b) are sectional views showing an example of a method of manufacturing the semiconductor integrated circuit device according to the embodiment as a sequence of processes.

FIG. 8(a) and FIG. 8(b) are sectional views showing an example of a method of manufacturing the semiconductor integrated circuit device according to the embodiment as a sequence of processes.

FIG. 9(a) and FIG. 9(b) are sectional views showing an example of a method of manufacturing the semiconductor integrated circuit device according to the embodiment as a sequence of processes.

FIG. 10(a) and FIG. 10(b) are sectional views showing an example of a method of manufacturing the semiconductor integrated circuit device according to the embodiment as a sequence of processes.

FIG. 11(a) and FIG. 11(b) are sectional views showing an example of a method of manufacturing the semiconductor integrated circuit device according to the embodiment as a sequence of processes.

FIG. 15(a) and FIG. 15(b) are sectional views showing an example of a method of manufacturing the semiconductor integrated circuit device according to the embodiment as a sequence of processes.

FIG. 21(a) and FIG. 21(b) are sectional views showing an example of a method of manufacturing the semiconductor integrated circuit device according to the embodiment as a sequence of processes.

FIG. 23(a) and FIG. 23(b) are sectional views showing an example of a method of manufacturing the semiconductor integrated circuit device according to the embodiment as a sequence of processes.

DESCRIPTION OF THE PREFERRED EMBODIMENTS

One embodiment of this invention will now be described in detail with reference to the drawings. In all of the drawings which illustrate this embodiment, the same symbols are used for members having identical functions, and their description will not be repeated.

Figure 1:
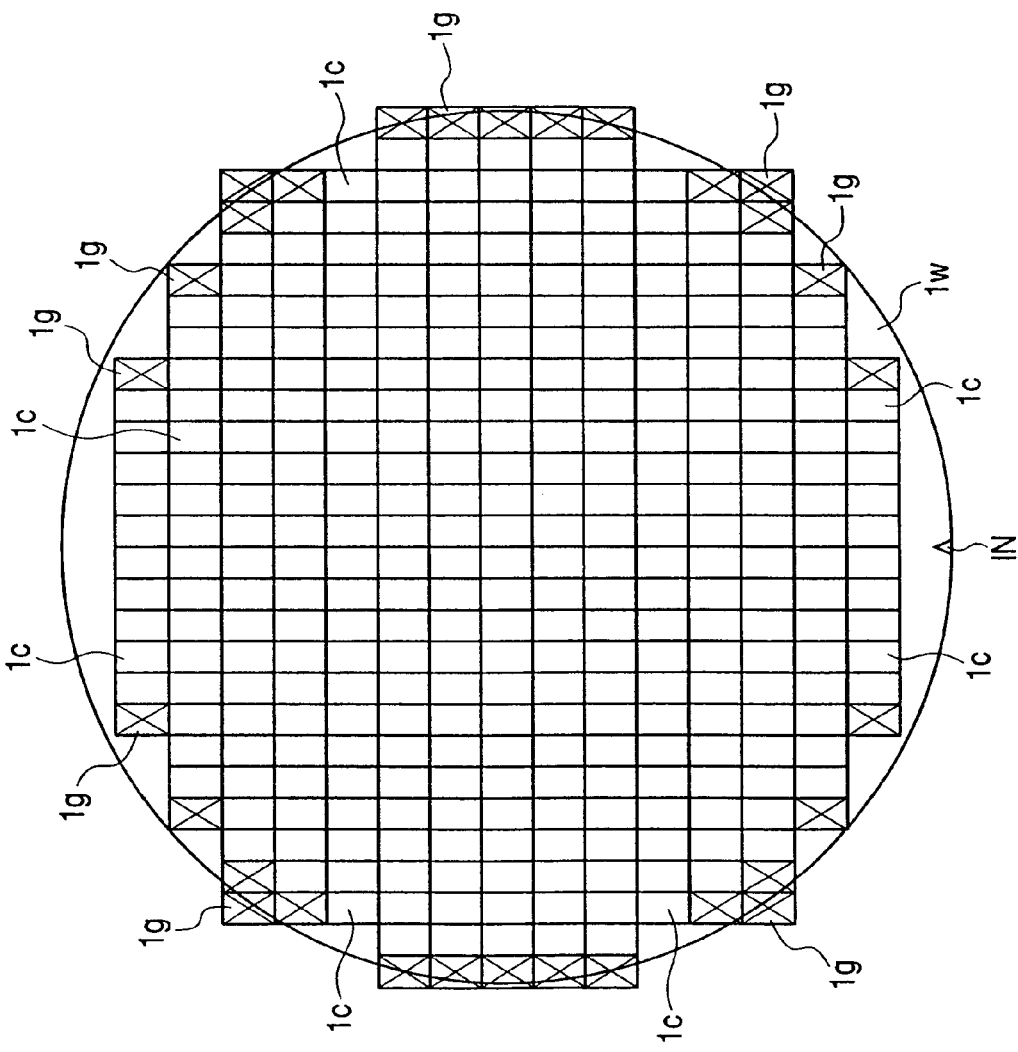
FIG. 1 is a plan view showing a silicon wafer used for manufacturing a semiconductor integrated circuit device according to one embodiment of this invention.

FIG. 1 is a plan view showing a silicon wafer used for manufacturing a semiconductor integrated circuit device according to one embodiment of the invention. A notch in is made in a single crystal silicon wafer 1w and serves as a crystal plane index mark of the wafer 1w. A chip 1c is formed on the wafer 1w. The chip 1c is formed in the effective processing area of the wafer 1w, and a chip region 1g outside the effective processing area is not used.

Figure 2:
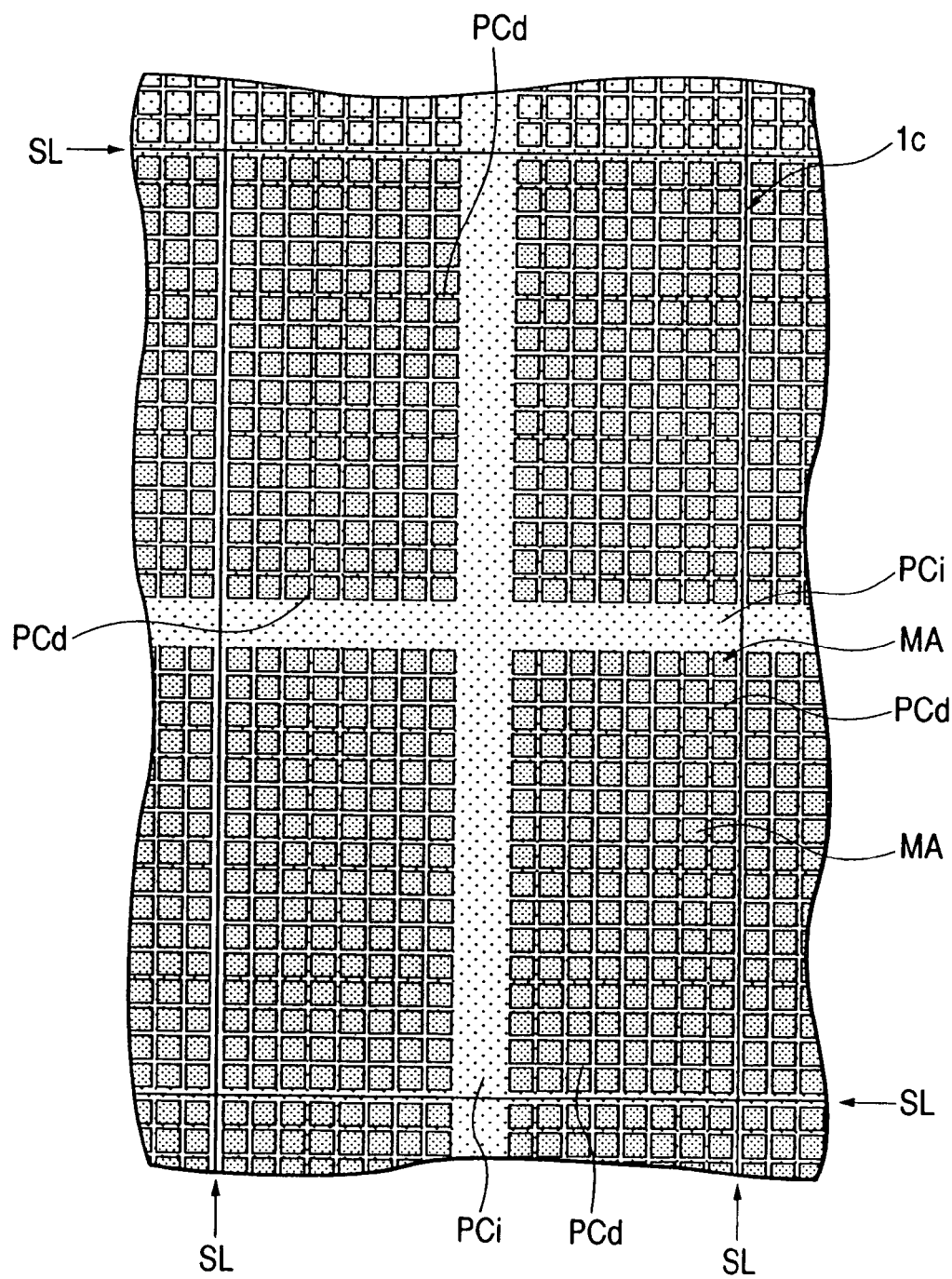
FIG. 2 is a plan view showing an enlargement of a chip part of a wafer according to this embodiment.

FIG. 2 is a plan view showing an enlargement of the chip 1c of the wafer 1w. The chip 1c is scribed and divided by a scribe line SL. In the steps described hereafter, each step is performed in the state of the wafer 1w, the chip 1c being divided in the final step.

In this form of the invention, the typical DRAM chip 1c is shown as an example. It may also be another product, for example a logic product, such as a CPU, a memory element, such as an SRAM (Static Random Access Memory), or a memory which can be erased in one step and be electrically rewritten (so-called EEPROM: Electrical Erasable Read Only Memory), or a system LSI where a logic circuit and memory element coexist on the same chip. A memory cell array MA, direct peripheral circuit PCd and indirect peripheral circuit Pci are formed in the chip 1c. DRAM memory cells are formed in the memory cell array MA. The direct peripheral circuit PCd is formed on the periphery of the memory cells MA. The indirect peripheral circuit Pci is formed in the center region of the chip 1c.

Figure 3:
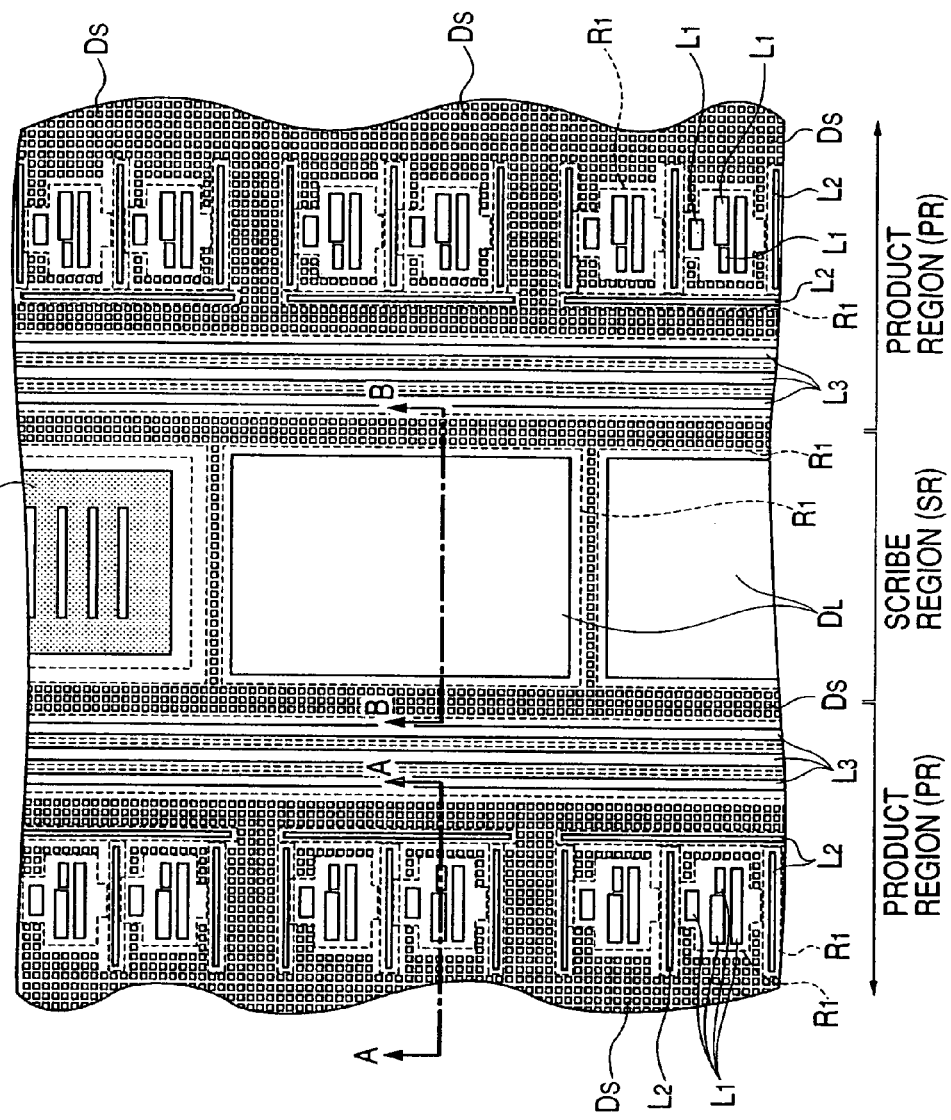
FIG. 3 is a plan view showing an end region of the chip comprising a scribe line.

FIG. 3 is a plan view showing an edge region of the chip 1c comprising the region of the scribe line SL. FIG. 3 shows the state where an isolation region is formed on a semiconductor substrate 1 (wafer 1w, chip 1c). The regions other than a scribe region SR are product regions PR.

A target pattern T1, large area dummy pattern DL and small area pattern Ds are formed simultaneously when the isolation region is formed in the scribe region SR. A TEG (Test Equipment Group) element is also formed in the scribe region SR, but it is not shown in the drawings. The target pattern T1 is a pattern formed simultaneously in a step when an isolation region pattern is formed, and it is used for alignment in an exposure step when a gate electrode pattern, to be described later, is formed. Specifically, it is used as a target for position detection when mask alignment of a target electrode pattern is performed. In an exposure device, a mask is aligned with respect to the wafer by, for example, performing optical pattern recognition of the target, and a photoresist film is then exposed.

The large area dummy pattern DL and small area dummy pattern Ds are patterns which are simultaneously formed in the step when the isolation region pattern is formed. A target pattern T2 is formed simultaneously with the target electrode pattern on the large area dummy pattern DL. The target pattern T2 is used for alignment in the exposure step when the upper layer pattern, for example, an interconnection pattern or connecting hole pattern, is formed. Due to the provision of the large area pattern DL, dishing in the target pattern region is prevented, the recognition rate of the target pattern is improved, and fine patterning can advantageously be performed. In the prior art, a dummy pattern was not provided on the periphery of the prior art target pattern, so that the surface flatness of the target pattern periphery was impaired; however, by providing the large area dummy pattern DL underneath the target pattern, the flatness is improved and the recognition rate of the target pattern is improved. The large area dummy pattern DL is formed to be larger than the target pattern so as to enclose the target pattern. In other words, the large area dummy pattern DL is present underneath the target pattern region used for optical pattern recognition, so that dishing is prevented and the recognition rate of the target pattern is improved. On the periphery of the target pattern, there is a region where any kind of pattern is prohibited, thereby to prevent interference with target pattern recognition. The large area dummy pattern DL has an area equal to or greater than this pattern prohibition region. Therefore, the large area dummy pattern DL is not recognized as a pattern by the exposure device, and the recognition rate of the target patterns T1, T2 is not decreased.

The small area dummy pattern Ds is formed in the scribe region SR and the product region PR. In other words, it is formed over the whole surface of the wafer W. Thus, the small area dummy pattern Ds is disposed in a region in which there is a wide interval between patterns functioning as elements. Since there is a wide interval between patterns functioning as elements, if the small area dummy pattern Ds were not disposed in this wide pattern interval, dishing would occur in the pattern interval. Since this dishing becomes larger in depth as the pattern interval becomes wider, the flatness is largely impaired. By disposing this small area dummy pattern Ds in this wide inter-pattern space, the flatness is improved. As the pattern size and inter-pattern space are formed with dimensions of approximately the same order as those of the pattern forming the elements, the pattern interval is narrow, and a small amount of dishing according to the narrow pattern interval occurs. In this situation, the depression amount can be much improved and the flatness can be improved compared with the case when the dummy pattern is not provided. The pattern size of the small area dummy pattern Ds is of the same order as the element design rule, and a suitable value is selected with regard to the ease of photolithography and the effect on suppression of dishing. When the element design rule is of the order of, for example, 0.2 µm, the pattern size of the small area dummy pattern Ds may also be set to the order of 0.2 µm. However, if a KrF excimer laser is used as the exposure light source, a technique must be used to improve the resolution, such as use of a Levenson mask. If priority is given to the ease of forming the mask, the pattern size of the small area dummy pattern Ds may be set to be of the order of 1 µm, and the inter-pattern space may be set to be of the order of 0.4 µm. It will of course be understood that other figures can be selected from the requirements of the photolithography step. However, if the pattern size and inter-pattern space are too large, dishing in the inter-pattern space becomes more marked, which is undesirable.

The width of the scribe region SR is approximately 100 µm.

In FIG. 3, active regions which form elements are formed apart from the aforesaid small area dummy pattern Ds in the product region PR. According to this embodiment, an active region LI forming a channel region of a MISFET (Metal Insulator Semiconductor Field Effect Transistor), an active region L2 for well feed and an active region L3 for guard band feed are shown as examples. It will be understood that other active regions may also be formed. The aforesaid small area dummy pattern Ds is formed between the patterns of the active regions L1, L2, L3. The large area dummy pattern DL may also be formed in the product region PR.

FIG. 4 is a plan view showing an enlargement of a region comprising the active regions L1, L2 of the product region PR. Plural small area dummy patterns Ds are disposed between the patterns of the active regions L1, L2, as described above. As stated above, the pattern size d1 of the small area dummy pattern Ds is approximately 1 µm, and the pattern interval S1 is approximately 0.4 µm.

The small Area dummy pattern Ds is formed by automatically generating patterns of the aforesaid size in a lattice (grid) with the pattern pitch (1.4 µm in the case of this embodiment). At each lattice point, the small area dummy pattern Ds is not generated in parts where the active regions L1, L2 are present. Specifically, in a mask design device, a graphic computation is performed which expands patterns such as the active regions L1, L2. This expanded pattern region is a pattern prohibition region R1 of the small area dummy pattern Ds. Next, of the aforesaid lattice points, the lattice within the pattern prohibition region R1 is excluded from the graphic computation, and the small area dummy pat@ern Ds is generated at the remaining lattice points. This generated small area dummy pattern Ds is added to the active regions R1, R2 to give mask generation data. The pattern prohibition region R1 for the small area dummy pattern Ds is formed also on the periphery of the large area dummy pattern DL. As a result, the pattern to be expanded also contains the large area dummy pattern DL. In this way, a mask pattern wherein dummy patterns are disposed is easily generated automatically. This can also be done manually or automatically by disposing a layer (pattern layer) corresponding to the pattern prohibition region R1, and then specifying positions where it is not desired to dispose other small area dummy patterns Ds.

Next, the method of manufacturing the semiconductor integrated circuit device of this invention will be described, including the steps for forming the aforesaid active regions and a dummy region (isolation region) DR.

FIG. 5 to FIG. 23 (excluding FIG. 17, FIG. 18) are sectional views showing the sequence of steps in one example of the method of manufacturing the semiconductor integrated circuit device of this invention. In these sectional views, figures with numbers to which (a) is appended represent a section as seen on a line A—A in FIG. 3 and FIG. 4, and figures with numbers to which (b) is appended represent a section through a line B—B in FIG. 3. In the (a) figures, the dummy region DR where a dummy pattern is formed, circuit region CR and voltage supply region SR where a voltage supply pattern is formed, are respectively shown. In the (b) figures, a target region TR, small area dummy pattern prohibition region IR and dummy region DR are respectively shown.

As shown in FIGS. 5(a) and 5(b), the semiconductor substrate 1 (wafer 1w) is provided, and a thin silicon oxide (SiO) film 2 and silicon nitride (SiN) film 3 are formed thereon. The semiconductor substrate 1 is a single crystal silicon wafer wherein, for example, p type impurities are introduced, and it has a resistivity of the order of several ohmcm. The silicon oxide film 2 is a sacrifice film for alleviating the stress between the silicon nitride film 3 and semiconductor substrate 1, and it is formed, for example, by thermal oxidation. The silicon nitride film 3 is used as a mask for forming a groove, as will be described later. The film thickness of the silicon nitride film 3 is several hundred nm, and it is formed for example by CVD (Chemical Vapor Deposition).

Next, as shown in FIGS. 6(a) and 6(b), a photoresist film 4 is formed on the silicon nitride film 3. The photoresist film 4 is formed to cover the regions where the active regions L1, L2, L3, the large area dummy pattern DL and the small area dummy pattern Ds, which were described in FIG. 3 and FIG. 4, are respectively formed. As stated above, regarding the size of the small area dummy pattern Ds, the fine patterning which would be required with a Levenson mask is not necessary, so that in the region where the small area dummy pattern Ds is formed, there is no impairment of machinability due to the decrease of focal point tolerance that is inherent in super-high resolution techniques, such as the Levenson method. This simplifies the mask design.

Next, as shown in FIGS. 7(a) and 7(b), dry etching is performed in the presence of the photoresist film 4, and the silicon nitride film 3 and silicon oxide film 2 are etched to remove them.

After the photoresist film 4 is removed, as shown in FIGS. 8(a) and 8(b), dry etching (anisotropic etching) is performed in the presence of the silicon nitride film 3, and the semiconductor substrate 1 is etched to form a groove S. The depth of the groove 5 is several hundred nm. The pattern of the groove 5 formed in this step is the reverse of the pattern of the active regions L1, etc., shown in the aforesaid FIG. 3 and FIG. 4.

In this step, the patterned silicon nitride film 3 is used as a hard mask. By using the thin silicon nitride film 3 as a hard mask, the etching properties are improved, and fine patterning can easily be performed. Instead of using the silicon nitride film 3 as a hard mask, the semiconductor substrate 1 can be etched in the presence of the photoresist film 4 to form the groove 5. In this case, the steps are simplified.

Next, as shown in FIGS. 9(a) and 9(b), a silicon oxide film 6 is formed over the whole surface of the semiconductor substrate 1, including the interior of the groove 5. The silicon oxide film 6 can be formed by CVD using, for example, TEOS (tetraethoxysilane) gas and ozone ($O_3$) as raw material gases. The film thickness of the silicon oxide film 6 is a film thickness sufficient to fill the groove 5.

Next, as shown in FIGS. 10(a) and 10(b), the silicon oxide film is polished using CMP. The polishing is performed until the surface of the silicon nitride film 3 is exposed. In this way, the isolation region 7 is formed leaving the silicon oxide film 6 only in the region of the groove 5.

In this process, in the dummy region DR, the small area dummy pattern Ds is formed, so dishing occurs only slightly between the patterns of the small area dummy pattern Ds, and the flatness can be remarkably improved compared with the case where the dummy pattern is not present. Further, as the large area dummy pattern DL is formed also in the target region TR, global dishing is prevented, and the flatness in this region is improved. In the case of this embodiment, the target region TR is formed in the scribe region SR, and deterioration of the flatness in the target region TR may occasionally cause a decrease in the flatness in the product region PR, which is adjacent to the target region TR. However, according to this embodiment, the large area pattern DL is formed in the target region TR, so there is no such effect on the product region PR.

Next, as shown in FIGS. 11(a) and 11(b), the silicon nitride film 3 and silicon oxide film 2 are removed to expose the active regions L1, L2, L3, large area dummy pattern DL and small area dummy pattern Ds. The aforesaid FIG. 3 and FIG. 4 show the stage when this step is completed. To remove the silicon nitride film 3, wet etching with hot phosphoric acid is used, for example. Subsequently, the surfaces of the silicon oxide film 2 and isolation region 7 are etched to a suitable degree by hydrofluoric acid (HF), and the substantially flat surface shown in FIGS. 11(a) and 11(b) is obtained.

Figure 12A:
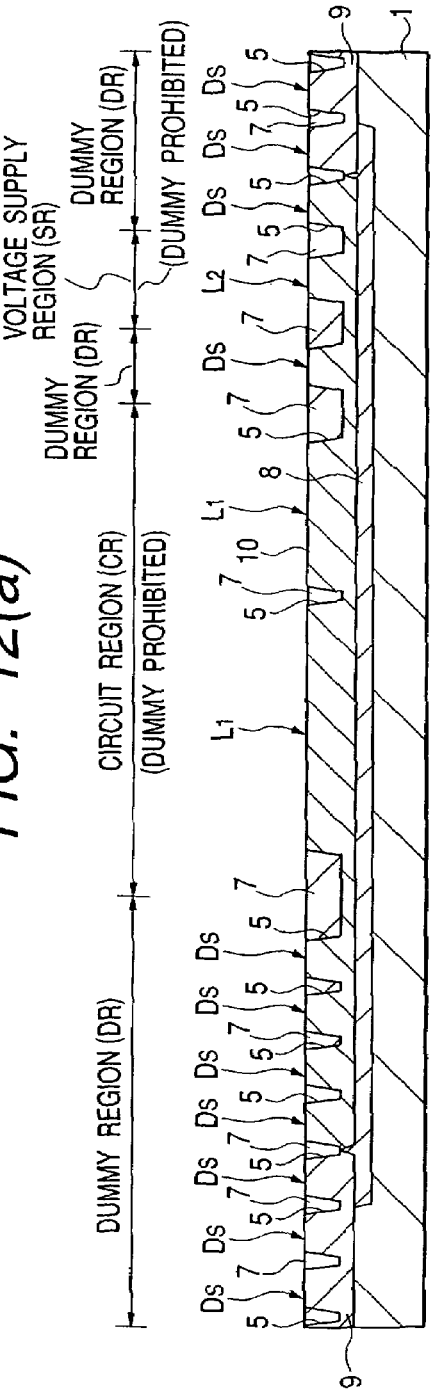
FIG. 12(a) and FIG. 12(b) are sectional views showing an example of a method of manufacturing the semiconductor integrated circuit device according to the embodiment as a sequence of processes.
Figure 12B:
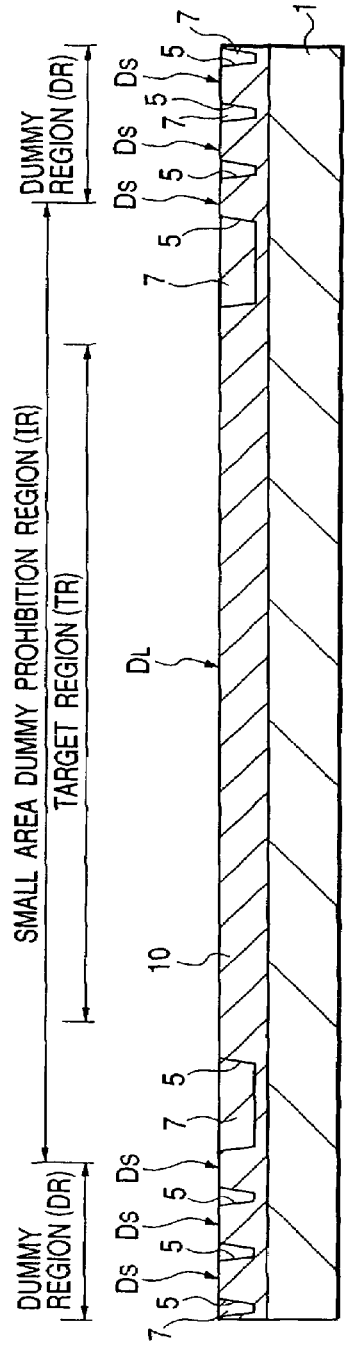

Next, as shown in FIGS. 12(a) and 12(b), a photoresist film, not shown, is formed; p type or n type impurities are ion implanted; and a deep well 8, n type well 9 and p type well 10 are formed. The deep well 8 functions to electrically isolate the p type well 10 from the semiconductor substrate 1.

Figure 13A:
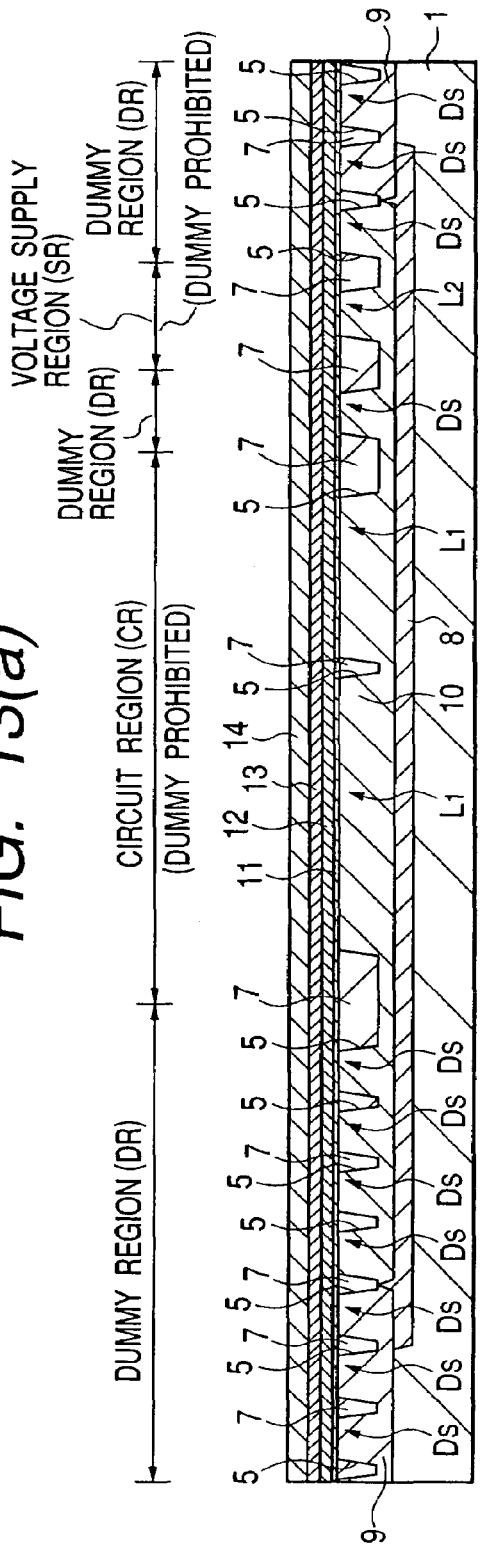
FIG. 13(a) and FIG. 13(b) are sectional views showing an example of a method of manufacturing the semiconductor integrated circuit device according to the embodiment as a sequence of processes.
Figure 13B:
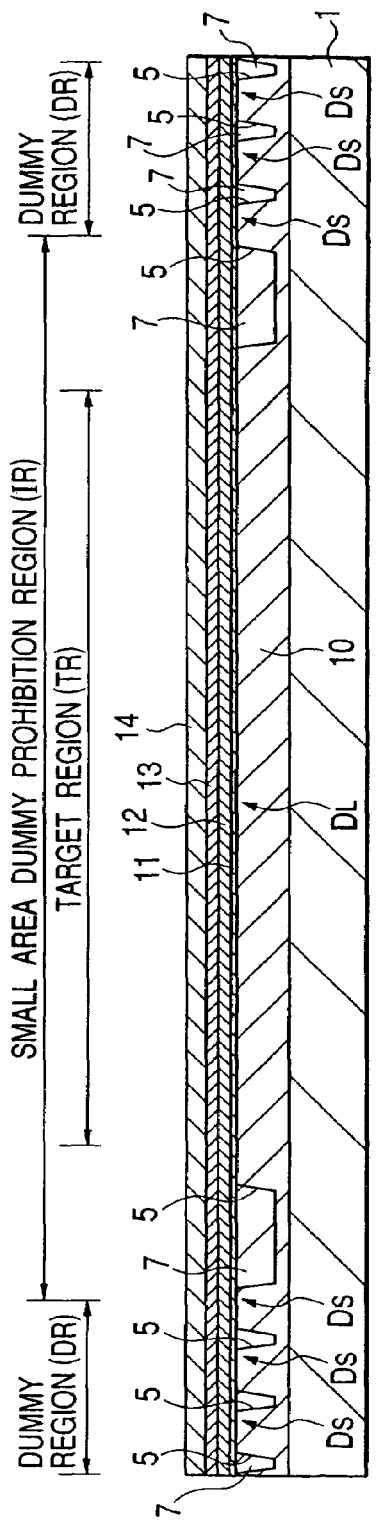

Next, as shown in FIGS. 13(a) and 13(b), a silicon oxide film 11, polycrystalline silicon film 12 and tungsten silicide (WSi) film 13, which function as a gate electrode, and a silicon nitride film 14, which functions as a gap insulating film, are deposited. The silicon nitride film 11 is formed, for example, by thermal oxidation or by thermal CVD, and has a film thickness of several nm. The polycrystalline silicon film 12 is formed, for example, by CVD, and n type or p type impurities are introduced into it. The film thickness is several hundred nm. The tungsten silicide film 13 is formed by CVD or by sputtering, and likewise, the film thickness is several hundred nm. The tungsten silicide film 13 decreases the sheet resistance of the gate electrode (gate interconnection) and contributes to improving the response speed of the element. The silicon nitride film 14 is formed, for example, by CVD, and has a film thickness of several hundred nm.

Here, the tungsten silicide film 13 was shown as an example, but other metal silicide films, such as a titanium silicide (TiSi) film or a cobalt silicide (CoSi) film may be used. Also, a laminate comprising the tungsten silicide film 13 and polycrystalline silicon film 12 was shown as an example, but laminates of the polycrystalline silicon film, a barrier film and a metal film, such as tungsten (W), may be used. In this case, the resistivity of the gate electrode (gate interconnection) can be further reduced. A metal nitride film, such as tungsten nitride (WN), titanium nitride (TiN) or tantalum nitride (TaN), may be used for the barrier film. In addition to tungsten, tantalum (Ta) or titanium (Ti) can also be used for the metal film.

Figure 14A:
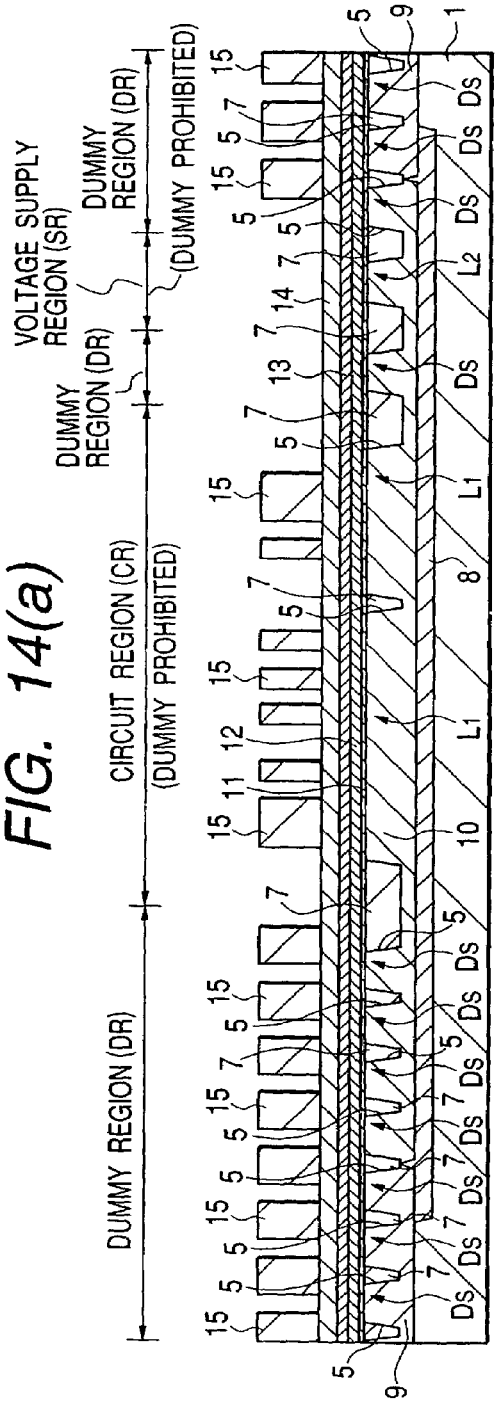
FIG. 14(a) and FIG. 14(b) are sectional views showing an example of a method of manufacturing the semiconductor integrated circuit device according to the embodiment as a sequence of processes.
Figure 14B:
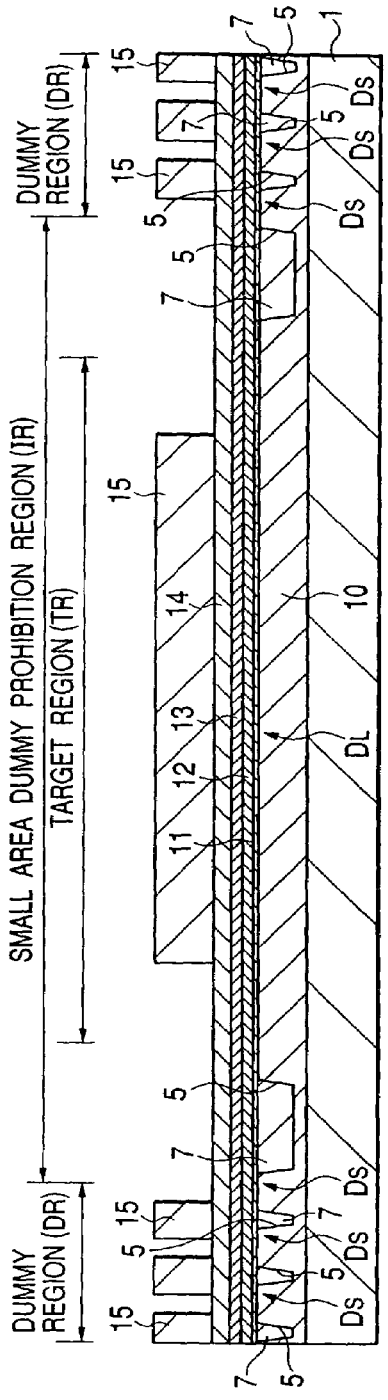

Next, as shown in FIGS. 14(a) and 14(b), a photoresist film 15 is formed on the silicon nitride film 14, and dry etching (anisotropic etching) is performed to pattern the silicon nitride film 14, as shown in FIGS. 15(a) and 15(b). In this way, a gap insulating film 16 is formed. The patterning of this gap insulating film 16 will be described later. In the exposure step for forming the photoresist film 15, the target T1 is used for position detection in mask alignment.

Figure 16A:
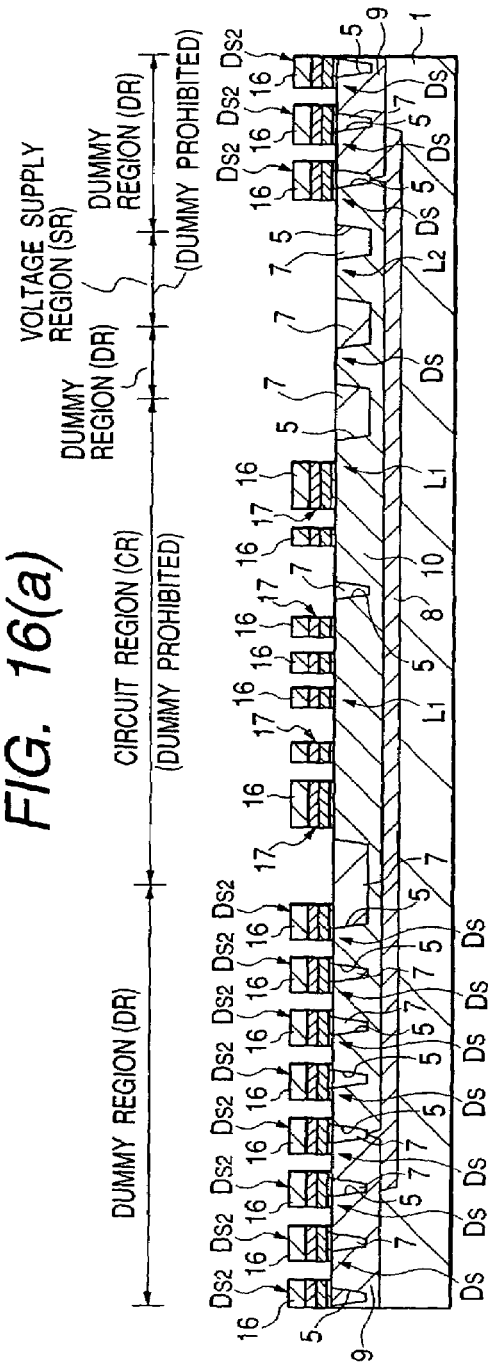
FIG. 16(a) and FIG. 16(b) are sectional views showing an example of a method of manufacturing the semiconductor integrated circuit device according to the embodiment as a sequence of processes.
Figure 16B:
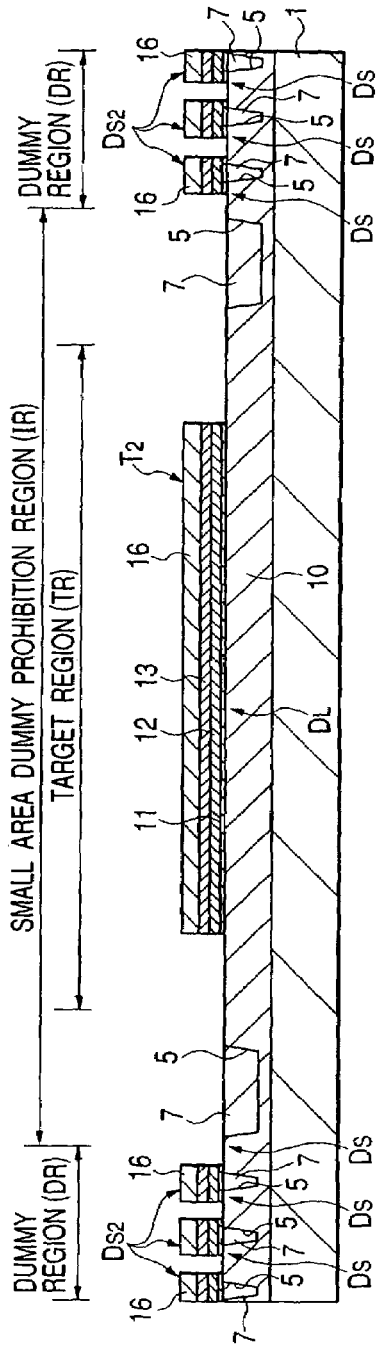

Next, the photoresist film 15 is removed by ashing or the like, and the tungsten silicide film 13, polycrystalline silicon film 12 and silicon oxide film 11 are etched (anisotropically etched) in the presence of the gap insulating film 16 to form a gate electrode 17, as shown in FIGS. 16(a) and 16(b).

At this time, a second small area dummy pattern Ds2 and target T2 are formed simultaneously with the gate electrode 17.

Figure 17:
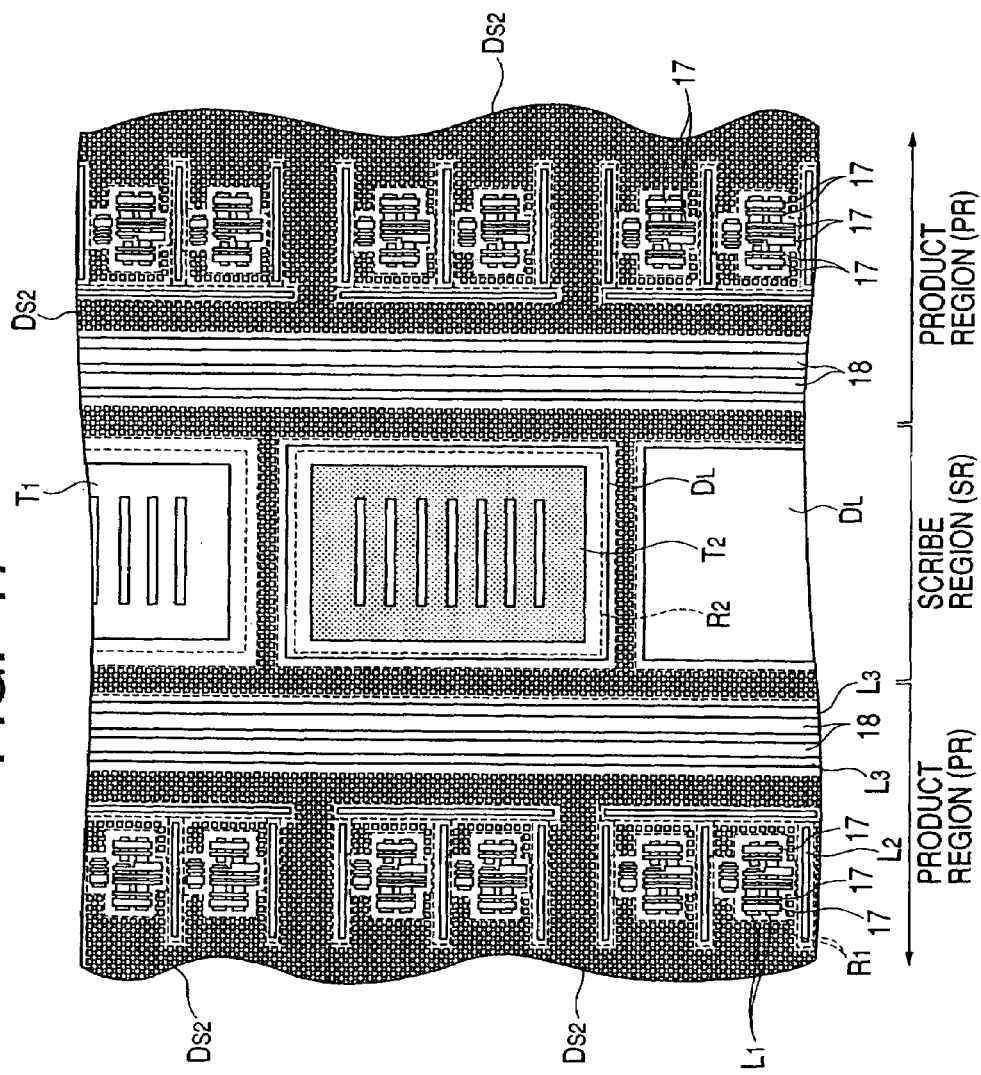
FIG. 17 is a plan view showing an example of a method of manufacturing the semiconductor integrated circuit device according to the embodiment as part of a sequence of processes.
Figure 18:
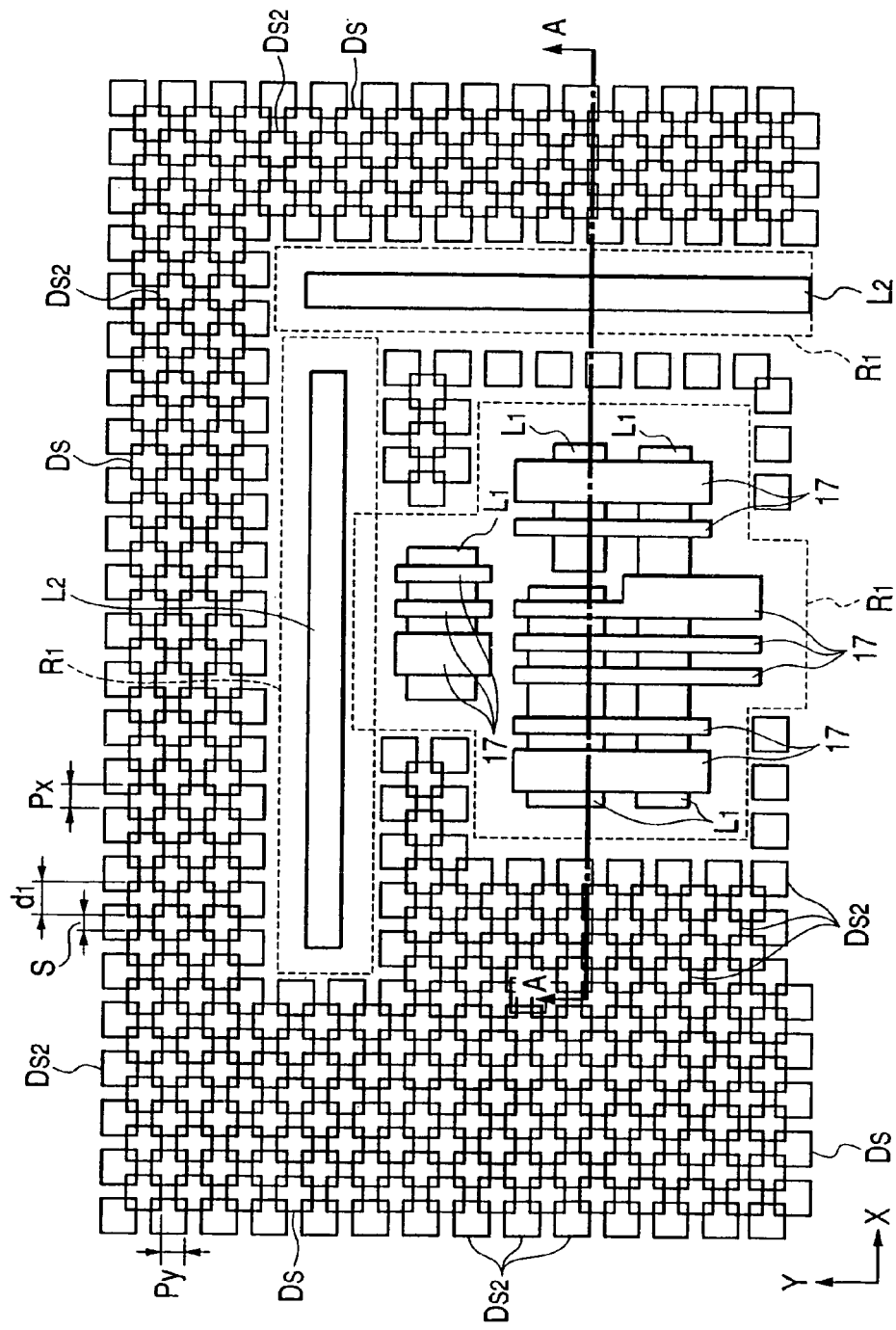
FIG. 18 is an enlarged plan view of FIG. 17.

FIG. 17 is a plan view showing the situation at this stage, corresponding to FIG. 3. FIG. 18 is an enlarged plan view corresponding to FIG. 4.

As shown in FIG. 17, the target T2 is formed in addition to the small area dummy pattern Ds2 in the scribe region SR. The target T2 is used for exposure, for example in a step to form interconnections or connection holes. The target T2 is formed on the large area dummy pattern DL so as to be enclosed by it. The pattern prohibition region R2 is also formed on the periphery of the target T2 to prevent a decrease in the recognition rate when the target T2 is used later, and the large area dummy pattern DL is formed to be larger than the pattern prohibition region R2. Hence, no pattern other than the target T2 is formed inside the pattern prohibition region R2, so that the target T2 can be accurately recognized. Further, since the target T2 is formed on the large area dummy pattern DL, the target T2 is not formed on a depressed substrate, but is formed on a flattened substrate. Therefore, in a subsequent exposure step using the target T2, the target T2 can be accurately recognized, and the mask alignment precision is improved. Further, since the large area dummy pattern DL is formed underneath the target T2, the flatness of this region is improved, the flatness of its periphery, in particular the product region PR adjacent to the target T2, is improved, which results in an improvement of the photolithography margin, and etching is easily performed.

The small area dummy pattern Ds2 is also formed in the scribe region SR. This improves the flatness of this region. However, it is not disposed in the small area dummy pattern prohibition region R1. The small area dummy pattern Ds2 will be described later.

The gate electrode 17 is formed in the product region PR. Plural small area dummy patterns Ds2 are disposed between the patterns of the gate electrode 17. As in the case of FIG. 3, they are not disposed in the small area dummy pattern prohibition region R2. The pattern prohibition region R1 is formed in the same way as described above.

The small area dummy pattern Ds2 is formed on the inter-pattern spaces of the small area dummy pattern Ds of the lower layer, as shown in FIG. 18. Specifically, the pitch of the small area dummy pattern Ds2 and that of the small area dummy pattern Ds in the layer underneath are offset by ½. In other words, the small area dummy pattern Ds2 is offset by Px in the x direction and by Py in the y direction with respect to the small area dummy pattern Ds. Px, Py are, for example, both 0.7 μm. In this way, by forming the small area dummy pattern Ds2 with an offset of ½ pitch, the effect of dishing in the layer underneath is eliminated and the flatness is improved. In other words, the dishing of the layer underneath occurs in a space part of the small area dummy pattern Ds, and since the small area dummy pattern Ds2 is formed on top of it, the dishing is not superimposed. Dishing due to the small area dummy pattern Ds2 occurs in its space part, but as the small area dummy pattern Ds is formed in the layer underneath it, dishing does not occur here. In other words, by providing the small area dummy patterns Ds, Ds2 as in this embodiment, dishing does not occur in the layer above the region where dishing occurs in the lower layer, and the part where dishing occurs in the upper layer is formed over the region where dishing does not occur in the lower layer. Hence, the total amount of dishing due to the two layers is reduced, and the overall flatness can be increased.

The situation wherein the small area dummy pattern Ds2 of the upper layer is not formed in the pattern prohibition region R1 is identical to the case of the small area dummy pattern Ds. Further, the small area dummy pattern Ds2 is generated in an identical way to the small area dummy pattern Ds, except that the lattice positions are shifted by ½ pitch.

Herein, a case was described where the small area dummy patterns Ds, Ds2 were shifted by ½ pitch, but the shift amount may be any value provided that the side edge of Ds2 is formed to overlap with Ds1. In other words, Ds2 must be formed in a part above the space part of Ds1.

Figure 19A:
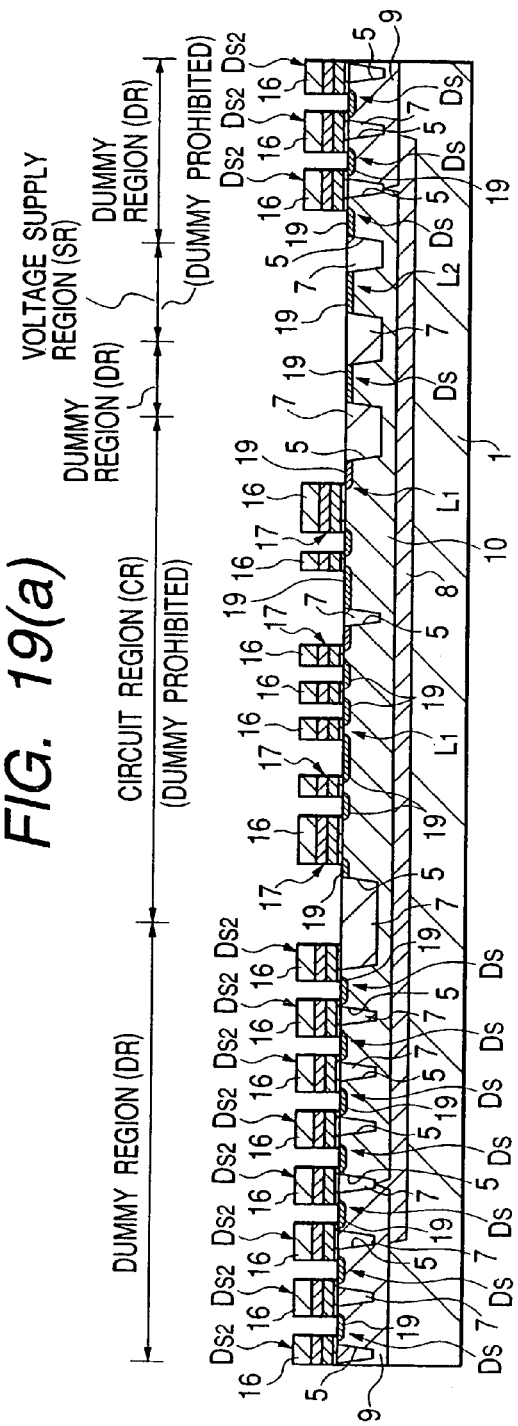
FIG. 19(a) and FIG. 19(b) are sectional views showing an example of a method of manufacturing the semiconductor integrated circuit device according to the embodiment as a sequence of processes.
Figure 19B:
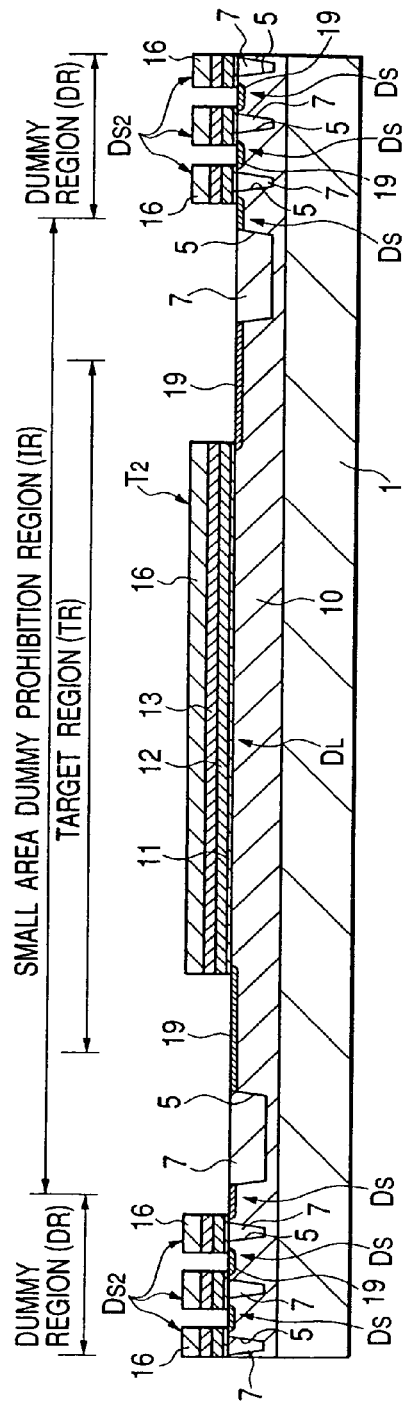

Next, impurities are ion-implanted to form an impurity semiconductor region 19, as shown in FIGS. 19(a) and 19(b). Low concentrations of impurities are introduced into the impurity semiconductor region 19. The conductivity of the impurity introduced is chosen according to the channel type of the MISFET that is being formed. Thus, p type impurities are implanted in an n type well region to form a p channel MISFET; and, n type impurities are introduced in a p well region to form an n channel MISFET.

Figure 20A:
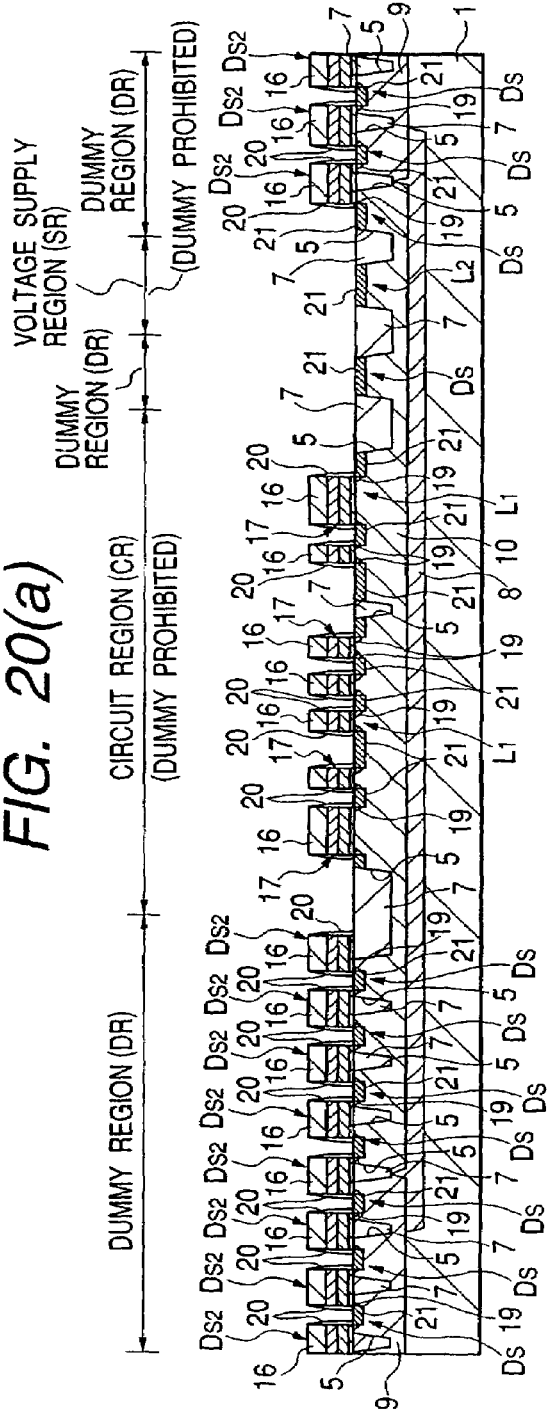
FIG. 20(a) and FIG. 20(b) are sectional views showing an example of a method of manufacturing the semiconductor integrated circuit device according to the embodiment as a sequence of processes.
Figure 20B:
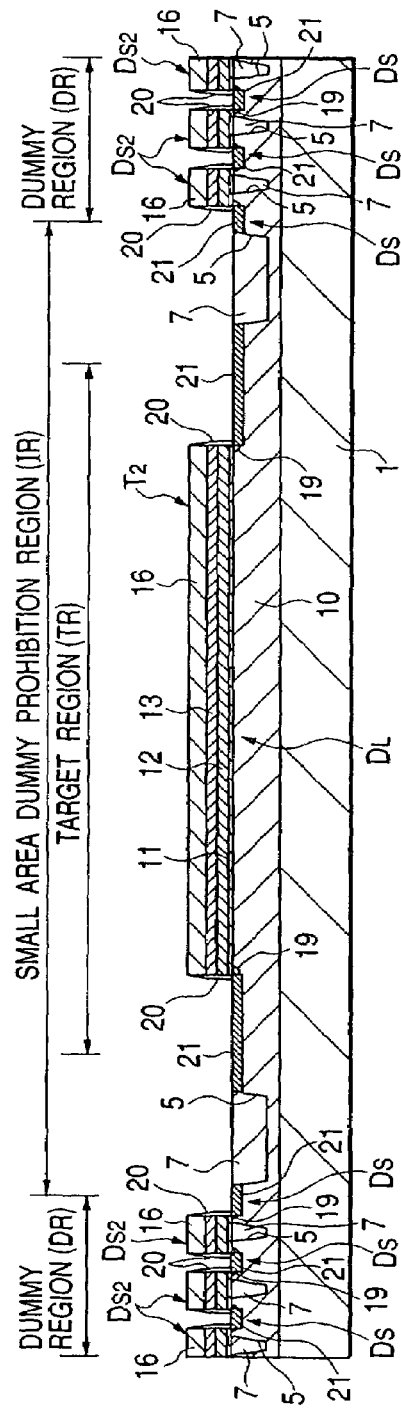

Next, as shown in FIGS. 20(a) and 20(b), a silicon nitride film, for example, is formed over the whole surface of the semiconductor substrate 1, and this is subjected to anisotropic etching to form a side wall spacer 20. Subsequently, ion implantation is performed to form an impurity semiconductor region 21. The impurity ions introduced into the impurity semiconductor region 21 are chosen to give a suitable conductivity depending on the region, as in the case described above. High concentrations of impurities are introduced into the impurity semiconductor region 21, and a source/drain having an LDD (Lightly Doped Drain) structure is formed together with the impurity semiconductor region 19.

Figure 22A:
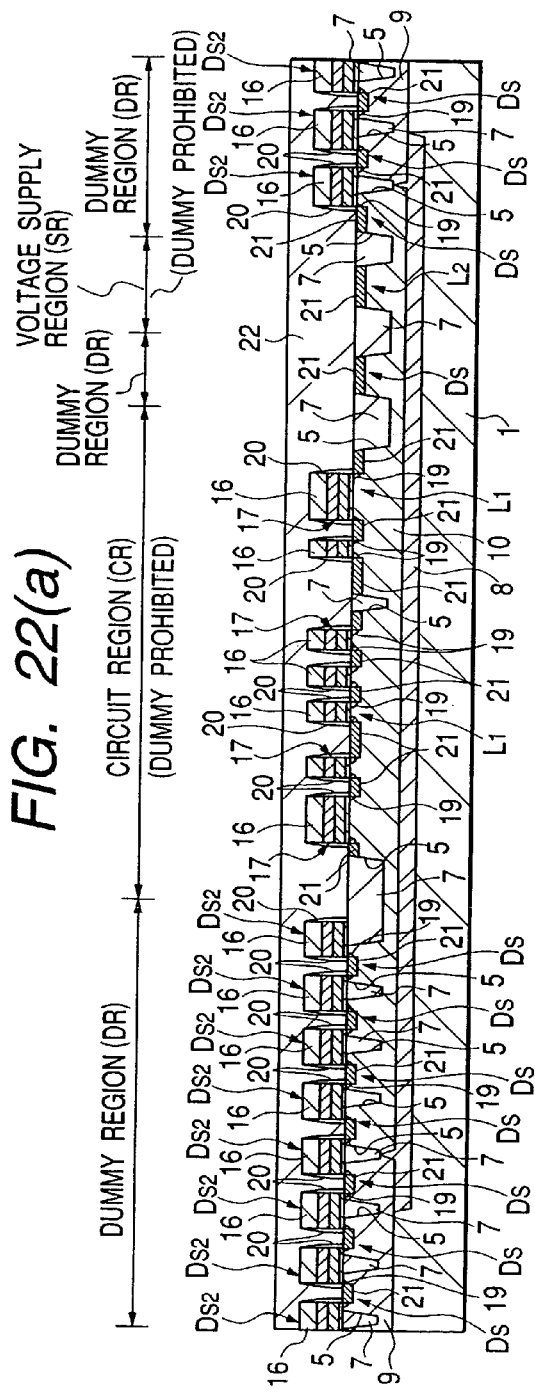
FIG. 22(a) and FIG. 22(b) are sectional views showing an example of a method of manufacturing the semiconductor integrated circuit device according to the embodiment as a sequence of processes.
Figure 22B:
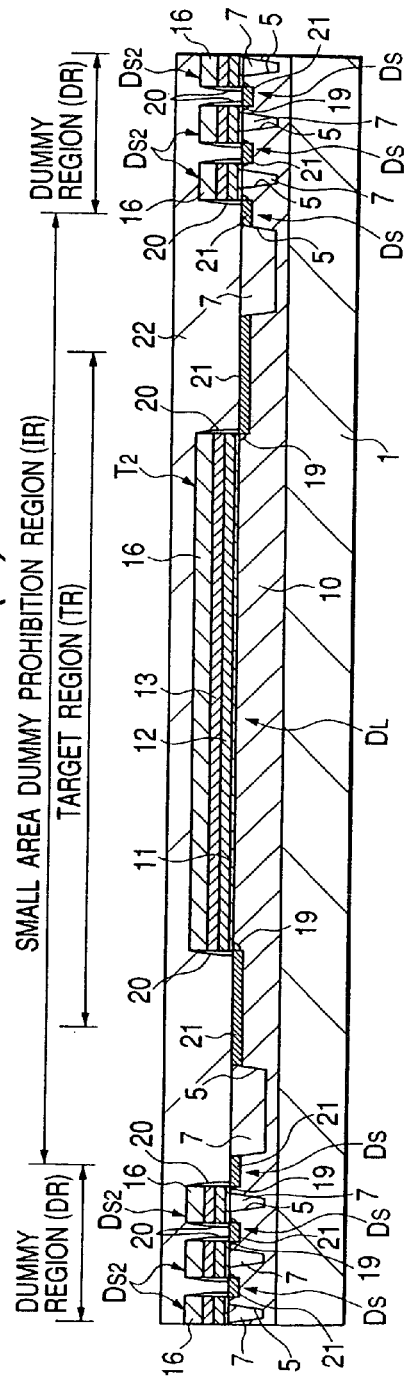

Next, as shown in FIGS. 21(a) and 21(b), a silicon oxide film 22 enclosing the gate electrode pattern is formed, and as shown in FIGS. 22(a) and 22(b), the silicon oxide film 22 is polished by CMP to flatten its surface. During this flattening, since the small area dummy pattern Ds2 is formed in the same layer as the gate electrode pattern, the flatness is improved. In particular, since the small area dummy pattern Ds2 is offset by ½ pitch with respect to the small area dummy pattern Ds of the lower layer, the dishing of the two layers in the spaces between the patterns is not superimposed. As a result, a decrease of the flatness due to superimposition of dishing is suppressed. Also, in the region of the target T2, since the large area dummy pattern DL is formed in the layer underneath, global dishing does not occur, and the flatness is improved also in the scribe region SR. Hence, there is no adverse effect on the product region PR, and the yield is improved. Moreover, the small area dummy pattern Ds2 is also disposed in the scribe region SR, so that the flatness is improved in the same way as in the product region PR.

Herein, a case was described wherein the target T2 was formed in the scribe region SR, but the target T2 may also be formed in the product region PR. Further, the target pattern was given as an example of a pattern required for pattern recognition, but it will be understood that the invention may also be applied to any pattern which can be used for optical pattern recognition. For example, it may be a testing pattern used for quality control in mask alignment, a test pattern for monitoring the film thickness, or a position detecting pattern used for laser repair.

Next, as shown in FIGS. 23(a) and 23(b), a connecting hole 23 is formed in the silicon oxide film 22, and a connecting plug 24 is formed in the connection hole 23. An interconnection 25 is also formed on the silicon oxide film 22.

The connecting hole 23 is formed by anisotropic etching using a photoresist film, not shown, as a mask. When this photoresist film is formed, i.e., for the exposure of this step, the aforesaid target T2 may be used for position detection in mask alignment. In addition to polycrystalline silicon, laminates of titanium nitride films and tungsten films may, for example, be used for the connecting plug. To form the connecting plug, a connecting hole is opened, an electrically conducting material is formed to fill it, and the electrically conducting film in regions other than the connecting hole is removed by CMP.

The interconnection 25 is formed by anisotropic etching using a photoresist film, not shown, in the same way. When this photoresist film is formed, i.e. for the exposure of this step, the aforesaid target T2 may be used for position detection in mask alignment. Metal materials, such as tungsten and laminates of, for example, titanium nitride and tungsten, may be used for the interconnection 25. The interconnection 25 is formed by forming a film of the metal material, and patterning it.

A multilayer interconnection structure can be formed by forming interconnections in the upper layers, such as the second and third layers, and since this is identical to the case of the aforesaid interconnection 25, its description will be omitted.

Figure 24:
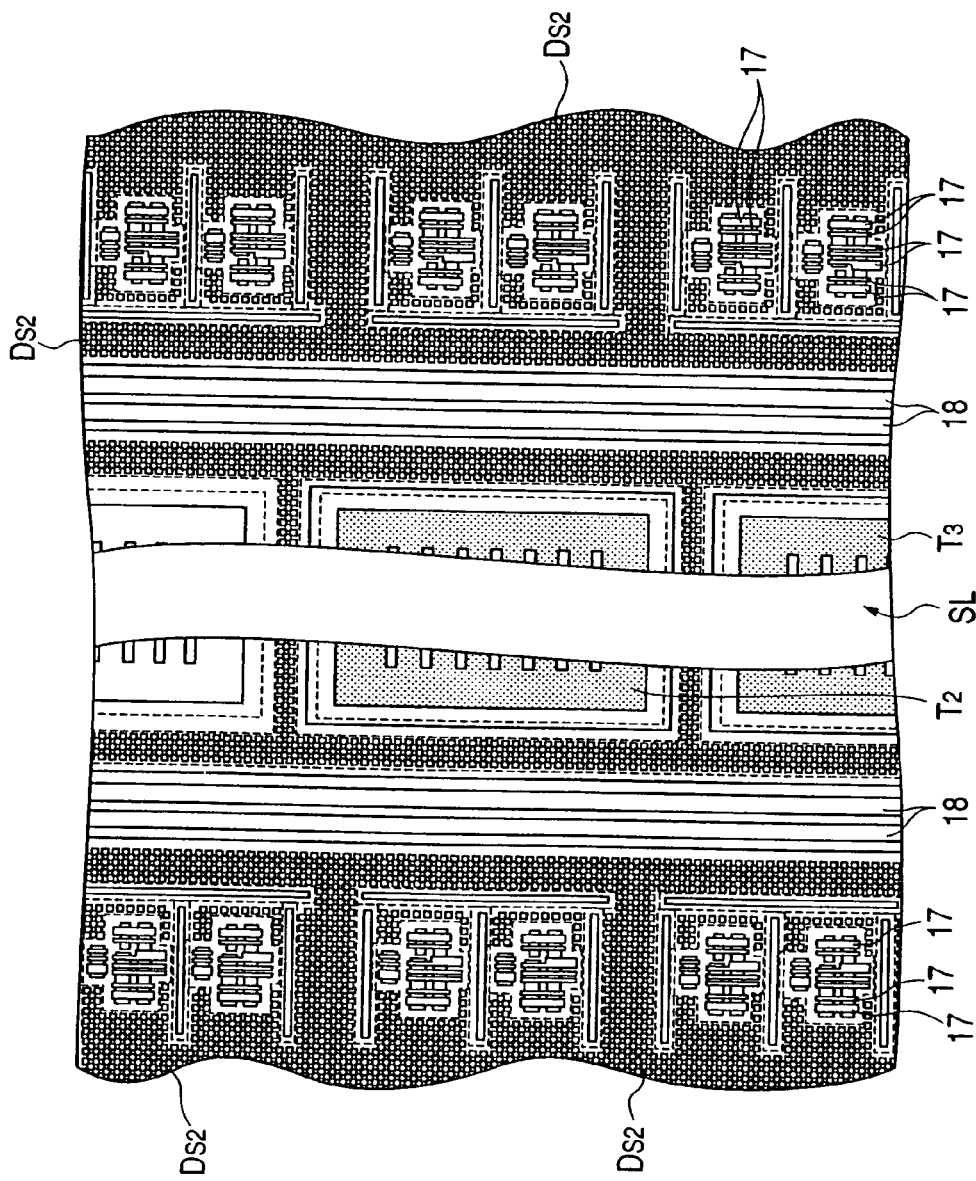
FIG. 24 is a plan view showing an example of a method of manufacturing the semiconductor integrated circuit device according to the embodiment as part of a sequence of processes.

FIG. 24 is a plan view showing the situation when the wafer process is complete, and the scribe region SR is at the scribe stage. The wafer 1w is divided by the scribe line SL to form the chip 1c. The width of the scribe line SL is a dimension obtained by adding play to the blade width (e.g., 35 μm) As a result, in the chip 1c, a region of the order of several tens of μm remains as the distance from the edge of the product region PR to the edge of the chip 1c. Part of the aforesaid targets T1, T2, and the large area dummy pattern DL, remain in this residual region. In FIG. 24, a target T3 is shown. This is a target pattern formed simultaneously when the interconnection 25 of the first layer is patterned. The target T3 is used to form an interconnection or through hole in the upper layer.

This invention as conceived by the inventors has been described in detail based on one embodiment of the invention, however it will be understood that the invention is not limited to this embodiment, various modifications being possible within the scope and spirit of the appended claims.

For example, in the embodiment, an example was given where the offset of the small area dummy patterns Ds, Ds2 was provided in both the x direction and y direction, but the offset may be provided in only one direction.

Figure 25:
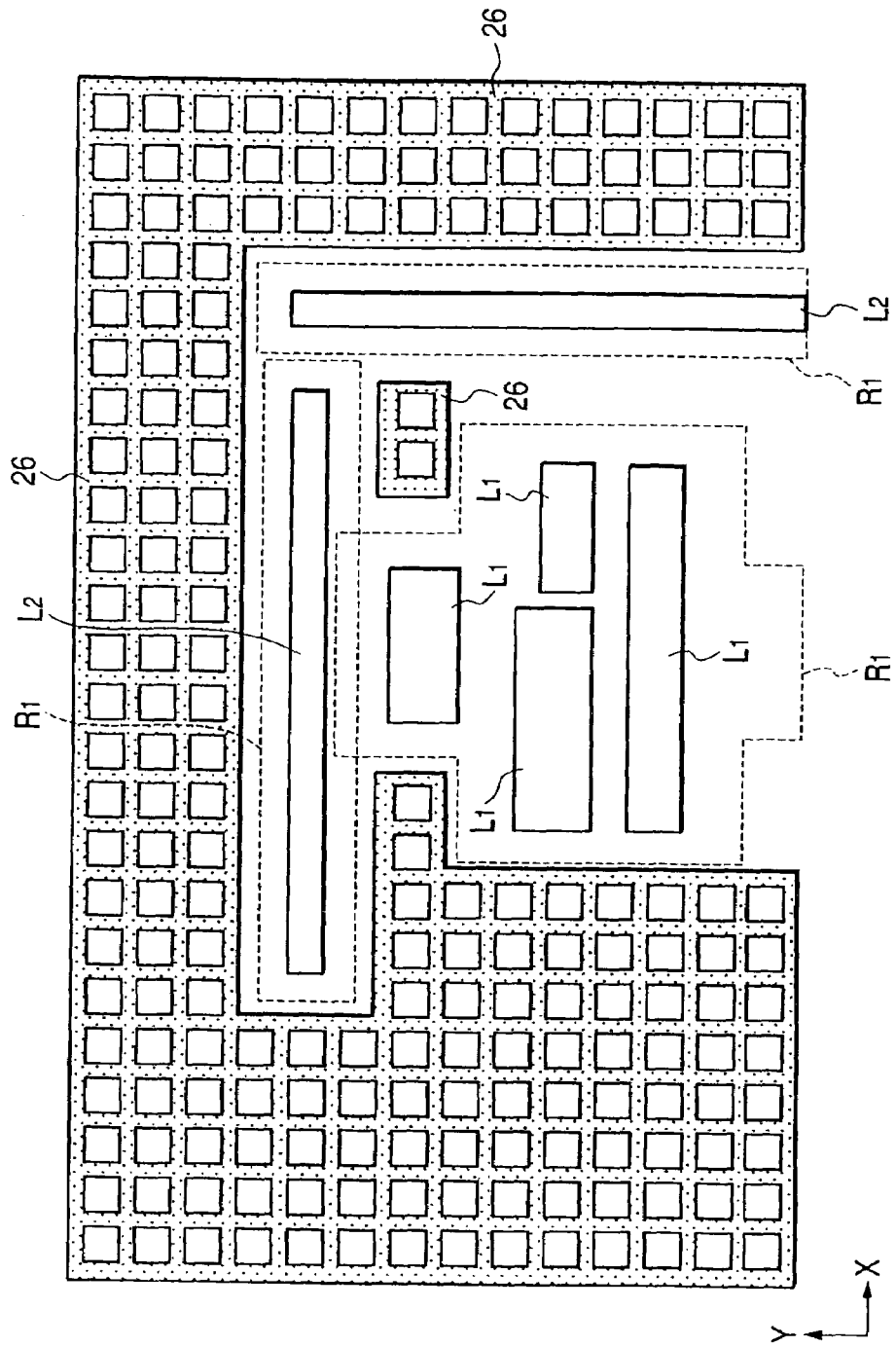
FIG. 25 is an enlarged plan view showing another example of the semiconductor integrated circuit device according to the embodiment.
Figure 26:
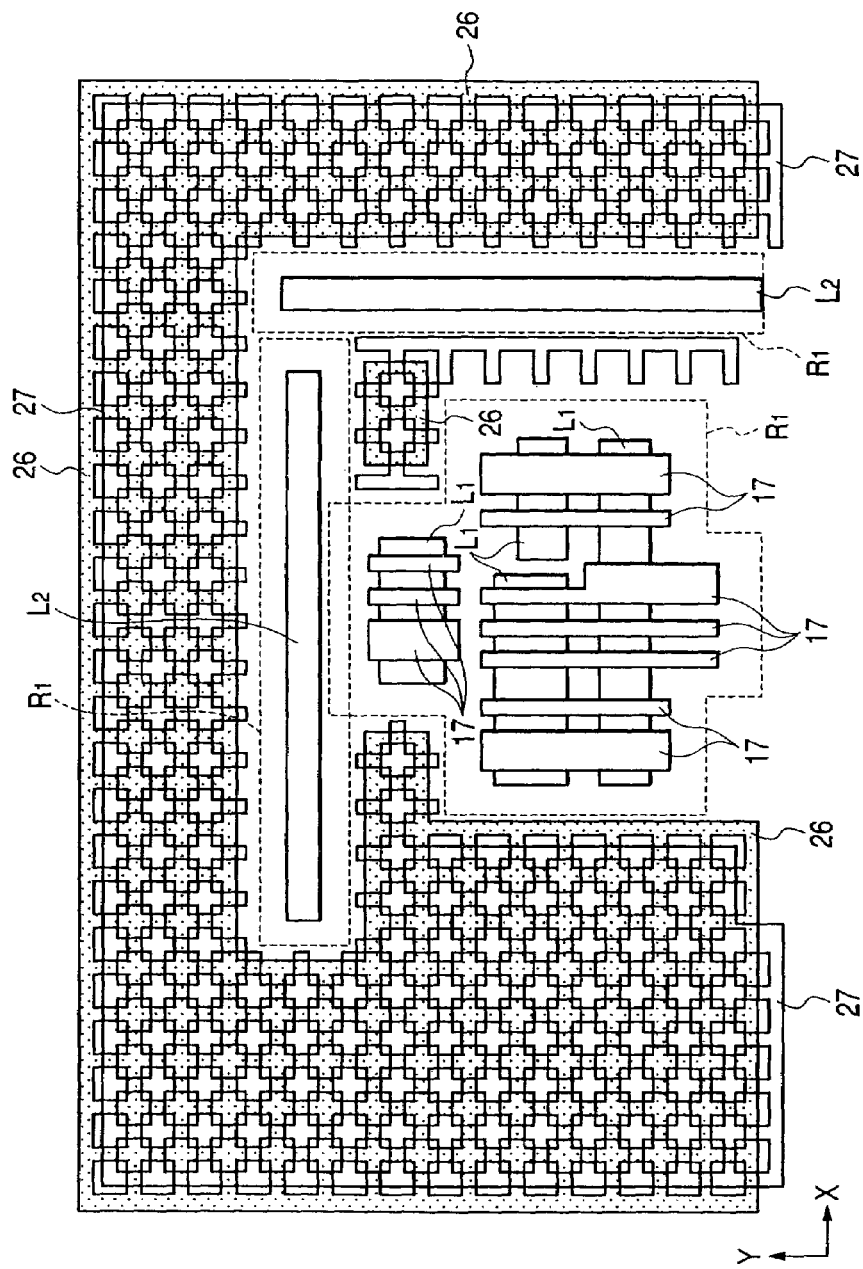
FIG. 26 is an enlarged plan view showing another example of the semiconductor integrated circuit device according to the embodiment.
Figure 27:
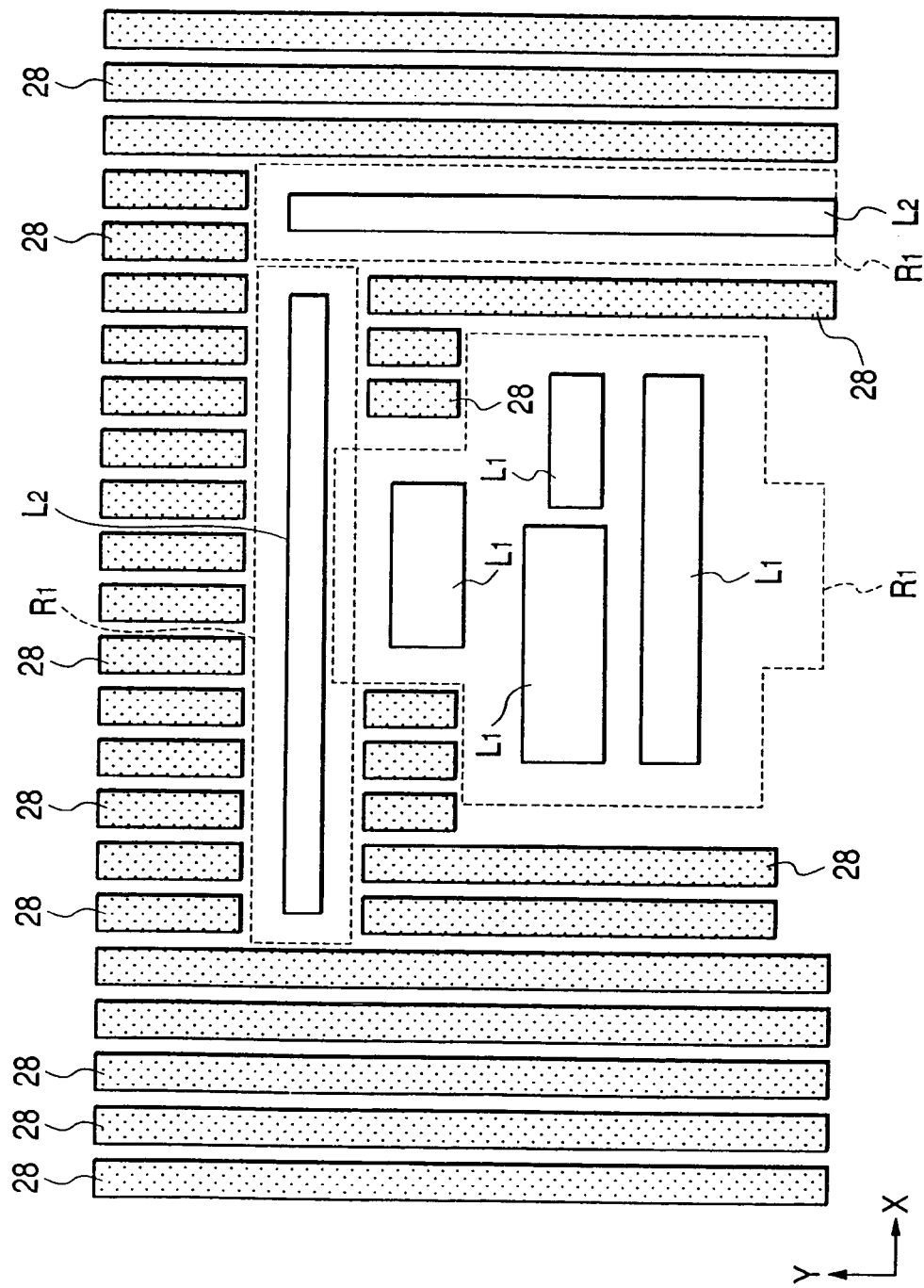
FIG. 27 is an enlarged plan view showing yet another example of the semiconductor integrated circuit device according to the embodiment.
Figure 28:
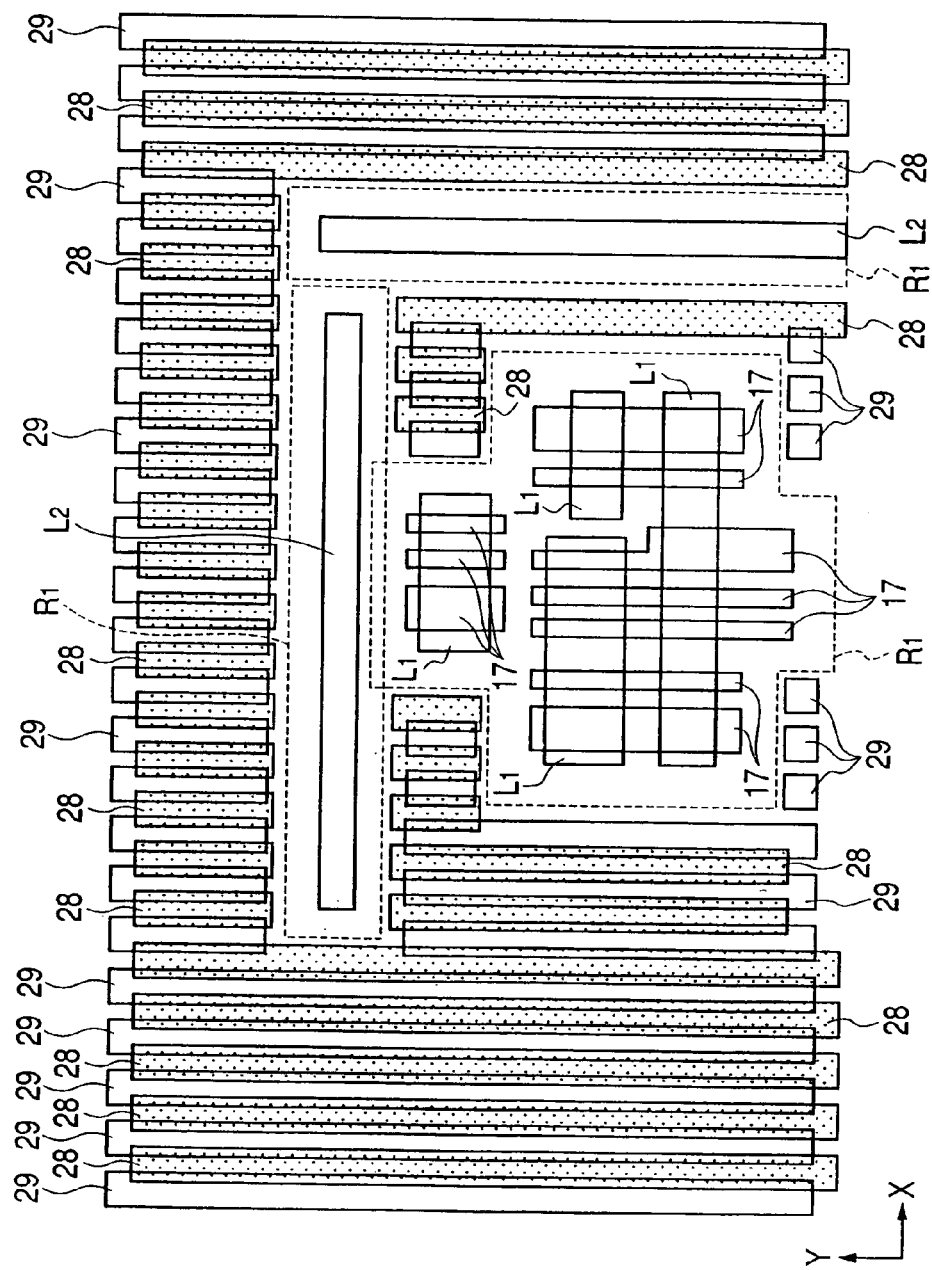
FIG. 28 is an enlarged plan view showing yet another example of the semiconductor integrated circuit device according to the embodiment.

Further, the case was shown where the small area dummy patterns Ds, Ds2 were rectangular, but they may also be of another shape, such as oblong. For example, they may be lattice-shaped dummy patterns, as shown in FIG. 25 and FIG. 26. Specifically, a lattice-shaped pattern 26 can be formed simultaneously with the active region L1, as shown in FIG. 25, or a lattice-shaped pattern 27 can be simultaneously formed with the gate electrode 17 with a ½ pitch shift relative to the pattern 26, as shown in FIG. 26. Alternatively, instead of the small area target patterns Ds, Ds2, line-shaped dummy patterns can be formed, as shown in FIG. 27 and FIG. 28. Specifically, a line-shaped dummy pattern 28 can be formed simultaneously with the active region L1, as shown in FIG. 27, or a line-shaped pattern 29 can be simultaneously formed with the gate electrode 17 with a ½ pitch shift relative to the pattern 28, as shown in FIG. 28. These dummy patterns 26, 27, 28, 29 are not formed in the pattern prohibition region R1, which is identical to the case of the embodiment. Further, the sizes of the patterns 26, 27, 28, 29 are also identical to those of the embodiment.

Among the inventive features disclosed in this application, the effects obtained by representative aspects of the invention may simply be described as follows.

(1) Dishing in plural laminated flattened surfaces is suppressed.

(2) Surface flattening in pattern regions of a large area for optical position detection, e.g., of targets, is improved.

(3) The flatness of plural laminated surfaces, or the flatness of large area patterns, such as targets, is improved, and the machining margin in a photolithography step and etching step is improved.

What is claimed is:

1. A semiconductor integrated circuit device comprising:
a groove formed in a semiconductor substrate and defining active regions and dummy regions,
said dummy regions including a first dummy region and second dummy regions;
an element isolation insulating film filled in said groove and serving as an element isolation region; and
a conductor pattern formed over said first dummy region and used for optical pattern recognition,
wherein said second dummy regions are formed at a product region and at a scribing region, and
wherein said first dummy region is formed at said scribing region.

2. A semiconductor integrated circuit device according to claim 1, wherein said second dummy regions are formed to surround said first dummy region.

3. A semiconductor integrated circuit device according to claim 1, wherein said conductor pattern is formed with the same level layer as a gate electrode of a MISFET formed over said active region.

4. A semiconductor integrated circuit device according to claim 1, wherein said conductor pattern is smaller than said first dummy region so as to be enclosed in said first dummy region.

5. A semiconductor integrated circuit device according to claim 1, wherein a width of said first dummy region is greater than a width each of said second dummy regions, wherein said second dummy regions are spaced from one another by a predetermined spacing at said scribing area.

6. A semiconductor integrated circuit device comprising:
a groove formed in a semiconductor substrate and defining active regions and dummy regions,
said dummy regions including a first dummy region and second dummy regions;
an element isolation insulating film filled in said groove and serving as an element isolation region; and
a conductor pattern formed over said first dummy region and used for optical pattern recognition,
wherein said first dummy region and said second dummy regions are formed at a scribing region.

7. A semiconductor integrated circuit device according to claim 6, wherein said second dummy regions are formed to surround said first dummy region.

8. A semiconductor integrated circuit device according to claim 6, wherein said conductor pattern is formed with the same level layer as a gate electrode of a MISFET formed over said active region.

9. A semiconductor integrated circuit device according to claim 6, wherein said conductor pattern is smaller than said first dummy region so as to be enclosed in said first dummy region.

10. A semiconductor integrated circuit device according to claim 5, wherein a width of said first dummy region is greater than a width of each of said second dummy regions, wherein said second dummy regions are spaced from one another by a predetermined spacing at said scribing area.

11. A semiconductor integrated circuit device comprising:
grooves formed in a semiconductor substrate and defining active regions and dummy regions,
said dummy regions including a first dummy region and second dummy regions;
element isolation insulating films filled in said grooves and serving as element isolation regions; and
a conductor pattern formed over said first dummy region and used for optical pattern recognition,
wherein said second dummy regions are formed at a product region and at a scribing region, and
wherein said first dummy region is formed at said scribing region.

12. A semiconductor integrated circuit device according to claim 11, wherein said second dummy regions are formed to surround said first dummy region.

13. A semiconductor integrated circuit device according to claim 11, wherein said conductor pattern is formed with the same level layer as a gate electrode of a MISFET formed over said active region.

14. A semiconductor integrated circuit device according to claim 11, wherein said conductor pattern is smaller than said first dummy region so as to be enclosed in said first dummy region.

15. A semiconductor integrated circuit device according to claim 11, wherein a width of said first dummy region is greater than a width of each of said second dummy regions, wherein said second dummy regions are spaced from one another by a predetermined spacing at said scribing area.

16. A semiconductor integrated circuit device comprising:
grooves formed in a semiconductor substrate and defining active regions and dummy regions,
said dummy regions including a first dummy region and second dummy regions;
element isolation insulating films filled in said grooves and serving as an element isolation region; and
a conductor pattern formed over said first dummy region and used for optical pattern recognition,
wherein said first dummy region and said second dummy regions are formed at a scribing region.

17. A semiconductor integrated circuit device according to claim 16, wherein said second dummy regions are formed to surround said first dummy region.

18. A semiconductor integrated circuit device according to claim 16, wherein said conductor pattern is formed with the same level layer as a gate electrode of a MISFET formed over said active region.

19. A semiconductor integrated circuit device according to claim 16, wherein said conductor pattern is smaller than said first dummy region so as to be enclosed in said first dummy region.

20. A semiconductor integrated circuit device according to claim 16, wherein a width of said first dummy region is greater than a width of each of said second dummy regions, wherein said second dummy regions are spaced from one another by a predetermined spacing at said scribing area.

21. A semiconductor integrated circuit device comprising:
a first groove and a second groove formed in a semiconductor substrate,
said first groove defining a first dummy region and second dummy regions;
said second groove defining an active region;
element isolation insulating films filled in said first groove and said second groove; and
a conductor pattern formed over said first dummy region and used for optical pattern recognition,
wherein said first dummy region and said second dummy regions are formed at a scribing region.

22. A semiconductor integrated circuit device according to claim 21, wherein said active region is formed at a product region.

23. A semiconductor integrated circuit device according to claim 21, wherein said first groove is integrally formed with said second groove.

24. A semiconductor integrated circuit device according to claim 21, wherein said conductor pattern is formed with the same level layer as a gate electrode of a MISFET formed over said active region.

25. A semiconductor integrated circuit device according to claim 21, wherein said conductor pattern is smaller than said first dummy region so as to be enclosed in said first dummy region.

26. A semiconductor integrated circuit device according to claim 21, wherein a width of said first dummy region is greater than a width of each of said second dummy regions, wherein said second dummy regions are spaced from one another by a predetermined spacing at said scribing area.

27. A semiconductor integrated circuit device comprising:
a first groove and a second groove formed in a semiconductor substrate,
said first groove defining a first dummy region and second dummy regions;
said second groove defining an active region and third dummy regions;
element isolation insulating films filled in said first groove and said second groove; and
a conductor pattern formed over said first dummy region and used for optical pattern recognition,
wherein said first dummy region and said second dummy regions are formed at a scribing region.

28. A semiconductor integrated circuit device according to claim 27, wherein said active region and third dummy regions are formed at a product region.

29. A semiconductor integrated circuit device according to claim 27, wherein said first groove is integrally formed with said second groove.

30. A semiconductor integrated circuit device according to claim 27, wherein said conductor pattern is formed with the same level layer as a gate electrode of a MISFET formed over said active region.

31. A semiconductor integrated circuit device according to claim 27, wherein said conductor pattern is smaller than said first dummy region so as to be enclosed in said first dummy region.

32. A semiconductor integrated circuit device according to claim 27, wherein a width of said first dummy region is greater than a width of each of said second dummy regions, wherein said second dummy regions are spaced from one another by a predetermined spacing at said scribing area.

33. A semiconductor integrated circuit device comprising:
a groove formed in a semiconductor substrate and defining active regions and a dummy region;
an element isolation insulating film filled in said groove and serving as an element isolation region; and
a conductor pattern formed over said dummy region and used for optical pattern recognition,
wherein said dummy region is formed at a scribing region, and
wherein an area of said dummy region is larger than that of said conductor pattern such that the whole area of said conductor pattern is arranged over said dummy region.

34. A semiconductor integrated circuit device according to claim 33, wherein said conductor pattern is formed with the same level layer as a gate electrode of a MISFET formed over said active region.

35. A semiconductor integrated circuit device comprising:
grooves formed in a semiconductor substrate and defining active regions and a dummy region;
element isolation insulating films filled in said grooves and serving as element isolation regions; and
a conductor pattern formed over said dummy region and used for optical pattern recognition,
wherein said dummy region is formed at a scribing region, and
wherein an area of said dummy region is larger than that of said conductor pattern such that the whole area of said conductor pattern is arranged over said dummy region.

36. A semiconductor integrated circuit device according to claim 35, wherein said conductor pattern is formed with the same level layer as a gate electrode of a MISFET formed over said active region.

37. A semiconductor integrated circuit device according to claim 36, wherein said first groove is integrally formed with said second groove.

38. A semiconductor integrated circuit device according to claim 36, wherein said conductor pattern is formed with the same level layer as a gate electrode of a MISFET formed over said active region.

39. A semiconductor integrated circuit device comprising:
a first groove and a second groove formed in a semiconductor substrate,
said first groove defining a dummy region; said second groove defining a active region;
element isolation insulating films filled in said first groove and said second groove; and
a conductor pattern formed over said dummy region and used for optical pattern recognition,
wherein said dummy region is formed at a scribing region, and
wherein an area of said dummy region is larger than that of said conductor pattern such that the whole area of said conductor pattern is arranged over said dummy region.

40. A semiconductor integrated circuit device comprising:
a first groove and a second groove formed in a semiconductor substrate,
said first groove defining a dummy region;
said second groove defining a active region;
element isolation insulating films filled in said first groove and said second groove; and
a conductor pattern formed over said dummy region and used for optical pattern recognition such than an area of said dummy region is larger than an area of said conductor pattern,
wherein said dummy region is formed at a scribing region.

41. A semiconductor integrated circuit device according to claim 40, wherein said first groove is integrally formed with said second groove.

42. A semiconductor integrated circuit device according to claim 40, wherein said conductor pattern is formed with the same level layer as a gate electrode of a MISFET formed over said active region.

43. A semiconductor integrated circuit device according to claim 40, wherein an area of said dummy region is larger than that of said conductor pattern such that the whole area of said conductor pattern is arranged over said dummy region.

44. A semiconductor integrated circuit device comprising:
a groove formed in a semiconductor substrate and defining active regions and dummy regions,
said dummy regions including a first dummy region and second dummy regions;
an element isolation insulating film filled in said groove and serving as an element isolation region; and
a conductor pattern formed over said first dummy region and used for optical pattern recognition such than an area of said dummy region is larger than an area of said conductor pattern,
wherein said second dummy regions are formed at a product region, and
wherein said first dummy region is formed at a scribing region.

45. A semiconductor integrated circuit device according to claim 44, wherein said conductor pattern is formed with the same level layer as a gate electrode of a MISFET formed over said active region.

46. A semiconductor integrated circuit device according to claim 44, wherein an area of said first dummy region is larger than that of said conductor pattern such that the whole area of said conductor pattern is arranged over said first dummy region.

47. A semiconductor integrated circuit device according to claim 44, wherein said second dummy regions are formed to surround said first dummy region.

48. A semiconductor integrated circuit device according to claim 44, wherein a width of said first dummy region is greater than a width of each of said second dummy regions, wherein said second dummy regions are spaced from one another by a predetermined spacing at said scribing area.

49. A semiconductor integrated circuit device comprising:
a groove formed in a semiconductor substrate and defining active regions and a dummy region,
an element isolation insulating film filled in said groove and serving as an element isolation region; and
a conductor pattern formed over said dummy region and used for optical pattern recognition such that an area of said dummy region is larger than an area of said conductor pattern, and wherein said dummy region is formed at a scribing region.

50. A semiconductor integrated circuit device according to claim 49, wherein said conductor pattern is formed with the same level layer as a gate electrode of a MISFET formed over said active region.

51. A semiconductor integrated circuit device according to claim 49, wherein an area of said dummy region is larger than that of said conductor pattern such that the whole area of said conductor pattern is arranged over said dummy region.

52. A semiconductor integrated circuit device comprising:
grooves formed in a semiconductor substrate and defining active regions and dummy regions,
said dummy regions including a first dummy region and second dummy regions;
element isolation insulating films filled in said grooves and serving as element isolation regions; and
a conductor pattern formed over said first dummy region and used for optical pattern recognition such than an area of said dummy region is larger than an area of said conductor pattern,
wherein said second dummy regions are formed at a product region, and
wherein said first dummy region is formed at a scribing region.

53. A semiconductor integrated circuit device according to claim 52 wherein said second dummy regions are formed to surround said first dummy region.

54. A semiconductor integrated circuit device according to claim 52, wherein said conductor pattern is formed with the same level layer as a gate electrode of a MISFET formed over said active region.

55. A semiconductor integrated circuit device according to claim 52, wherein an area of said first dummy region is larger than that of said conductor pattern such that the whole area of said conductor pattern is arranged over said first dummy region.

56. A semiconductor integrated circuit device according to claim 52, wherein a width of said first dummy region is greater than a width of each of said second dummy regions, wherein said second dummy regions are spaced from one another by a predetermined spacing at said scribing area.

57. A semiconductor integrated circuit device comprising:
grooves formed in a semiconductor substrate and defining active regions and a dummy region,
element isolation insulating films filled in said grooves and serving as an element isolation region; and
a conductor pattern formed over said first dummy region and used for optical pattern recognition such that an area of said dummy region is larger than an area of said conductor pattern, and wherein said dummy region is formed at a scribing region.

58. A semiconductor integrated circuit device according to claim 57, wherein said second dummy regions are formed to surround said first dummy region.

59. A semiconductor integrated circuit device according to claim 57, wherein said conductor pattern is formed with the same level layer as a gate electrode of a MISFET formed over said active region.

60. A semiconductor integrated circuit device according to claim 57, wherein an area of said first dummy region is larger than that of said conductor pattern such that the whole area of said conductor pattern is arranged over said first dummy region.

61. A semiconductor integrated circuit device comprising:
a groove formed in a semiconductor substrate and defining a first dummy region;
an element isolation insulating film filled in said groove such that said element isolation insulating film serves as an element isolation region; and
a conductor pattern formed over said first dummy region and used for optical pattern recognition,
wherein said first dummy region is formed under said conductor pattern such that said element isolation insulating film is not formed under said conductor pattern, and
wherein said first dummy region is formed at a scribing area.

62. A semiconductor integrated circuit device according to claim 61, wherein said conductor pattern is formed with the same level layer as a gate electrode of a MISFET.

63. A semiconductor integrated circuit device according to claim 61, wherein an area of said first dummy region is larger than an area of said conductor pattern.

64. A semiconductor integrated circuit device according to claim 61, wherein said groove is formed in said semiconductor substrate and defines said first dummy region and second dummy regions such that a width of said first dummy region is greater than a width of each of said second dummy regions; wherein said second dummy regions are located at said scribing area and are spaced from one another by a predetermined spacing.

65. A semiconductor integrated circuit device according to claim 61, wherein said groove is formed in said semiconductor substrate and defines said first dummy region and second dummy regions such that a width of said first dummy region is greater than a width of each of said second dummy regions, wherein said second dummy regions are located at said scribing area.

66. A semiconductor integrated circuit device comprising:
grooves formed in a semiconductor substrate and defining a first dummy region;
element isolation insulating films filled in said grooves such that said element isolation insulating films serve as an element isolation region; and
a conductor pattern formed over said first dummy region and used for optical pattern recognition,
wherein said first dummy region is formed under said conductor pattern such that said element isolation insulating film is not formed under said conductor pattern, and
wherein said first dummy region is formed at a scribing area.

67. A semiconductor integrated circuit device according to claim 66, wherein said conductor pattern is formed with the same level layer as a gate electrode of a MISFET.

68. A semiconductor integrated circuit device according to claim 66, wherein an area of said first dummy region is larger than an area of said conductor pattern.

69. A semiconductor integrated circuit device according to claim 66, wherein said grooves are formed in said semiconductor substrate and define said first dummy region and second dummy regions such that a width of said first dummy region is greater than a width of each of said second dummy regions, wherein said second dummy regions are located at said scribing area and are spaced from one another by a predetermined spacing.

70. A semiconductor integrated circuit device according to claim 69, wherein said conductor pattern is formed with the same level layer as a gate electrode of a MISFET.

71. A semiconductor integrated circuit device according to claim 69, wherein said second dummy regions each have a line-shaped pattern.

72. A semiconductor integrated circuit device according to claim 69, further comprising:
dummy conductor patterns formed with the same level layer as said conductor pattern, located at said scribing area and spaced from one another by a predetermined spacing.

73. A semiconductor integrated circuit device according to claim 72, wherein edge portions of said dummy conductor patterns extend over said second dummy regions.

74. A semiconductor integrated circuit device according to claim 72, wherein edge portions of said dummy conductor patterns are shifted from edge portions of said second dummy regions.

75. A semiconductor integrated circuit device according to claim 72, wherein said dummy conductor patterns each have a line-shaped pattern.

76. A semiconductor integrated circuit device according to claim 66, wherein said grooves are formed in said semiconductor substrate and define said first dummy region and second dummy regions such that a width of said first dummy region is greater than a width of each of said second dummy regions, wherein said second dummy regions are located at said scribing area.

77. A semiconductor integrated circuit device comprising:
a groove formed in a semiconductor substrate and defining a first dummy region;
an element isolation insulating film filled in said groove such that said element isolation insulating film serves as an element isolation region; and
a conductor pattern formed over said first dummy region and used for optical pattern recognition,
wherein said first dummy region is formed under said conductor pattern so as to extend beyond said conductor pattern, and
wherein said first dummy region is formed at a scribing area.

78. A semiconductor integrated circuit device according to claim 77, wherein said conductor pattern is formed with the same level layer as a gate electrode of a MISFET.

79. A semiconductor integrated circuit device according to claim 77, wherein an area of said first dummy region is larger than an area of said conductor pattern.

80. A semiconductor integrated circuit device according to claim 77, wherein said groove is formed in said semiconductor substrate and defines said first dummy region and second dummy regions such that a width of said first dummy region is greater than a width of each of said second dummy regions; wherein said second dummy regions are located at said scribing area and are spaced from one another by a predetermined spacing.

81. A semiconductor integrated circuit device according to claim 80, wherein said conductor pattern is formed with the same level layer as a gate electrode of a MISFET.

82. A semiconductor integrated circuit device according to claim 80, wherein said second dummy regions each have a line-shaped pattern.

83. A semiconductor integrated circuit device according to claim 80, further comprising:
dummy conductor patterns formed with the same level layer as said conductor pattern, located at said scribing area and spaced from one another by a predetermined spacing.

84. A semiconductor integrated circuit device according to claim 83, wherein edge portions of said dummy conductor patterns extend over said second dummy regions.

85. A semiconductor integrated circuit device according to claim 83, wherein edge portions of said dummy conductor patterns are shifted from edge portions of said second dummy regions.

86. A semiconductor integrated circuit device according to claim 83, wherein said dummy conductor patterns each have a line-shaped pattern.

87. A semiconductor integrated circuit device according to claim 77, wherein said groove is formed in said semiconductor substrate and defines said first dummy region and second dummy regions such that a width of said first dummy region is greater than a width of each of said second dummy regions, wherein said second dummy regions are located at said scribing area.

88. A semiconductor integrated circuit device comprising:
grooves formed in a semiconductor substrate and defining a first dummy region;
element isolation insulating films filled in said grooves such that said element isolation insulating films serve as an element isolation region; and
a conductor pattern formed over said first dummy region and used for optical pattern recognition,
wherein said first dummy region is formed under said conductor pattern so as to extend beyond said conductor pattern, and
wherein said first dummy region is formed at a scribing area.

89. A semiconductor integrated circuit device according to claim 88, wherein said conductor pattern is formed with the same level layer as a gate electrode of a MISFET.

90. A semiconductor integrated circuit device according to claim 88, wherein an area of said first dummy region is larger than an area of said conductor pattern.

91. A semiconductor integrated circuit device according to claim 88, wherein said grooves are formed in said semiconductor substrate and define said first dummy region and second dummy regions such that a width of said first dummy region is greater than a width of each of said second dummy regions; wherein said second dummy regions are located at said scribing area and are spaced from one another by a predetermined spacing.

92. A semiconductor integrated circuit device according to claim 91, wherein said conductor pattern is formed with the same level layer as a gate electrode of a MISFET.

93. A semiconductor integrated circuit device according to claim 91, wherein said second dummy regions each have a line-shaped pattern.

94. A semiconductor integrated circuit device according to claim 91, further comprising:
dummy conductor patterns formed with the same level layer as said conductor pattern, located at said scribing area and spaced from one another by a predetermined spacing.

95. A semiconductor integrated circuit device according to claim 94, wherein edge portions of said dummy conductor patterns extend over said second dummy regions.

96. A semiconductor integrated circuit device according to claim 94, wherein edge portions of said dummy conductor patterns are shifted from edge portions of said second dummy regions.

97. A semiconductor integrated circuit device according to claim 94, wherein said dummy conductor patterns each have a line-shaped pattern.

98. A semiconductor integrated circuit device according to claim 88, wherein said grooves are formed in said semiconductor substrate and define said first dummy region and second dummy regions such that a width of said first dummy region is greater than a width of each of said second dummy regions, wherein said second dummy regions are located at said scribing area.

99. A semiconductor integrated circuit device comprising:
a groove formed in a semiconductor substrate and defining a dummy region;
an element isolation insulating film filled in said groove such that said element isolation insulating film serves as an element isolation region; and
a conductor pattern formed over said first dummy region and used for optical pattern recognition,
wherein an area of said first dummy region is larger than an area of said conductor pattern, and
wherein said first dummy region is formed at a scribing area.

100. A semiconductor integrated circuit device according to claim 99, wherein said conductor pattern is formed with the same level layer as a gate electrode of a MISFET.

101. A semiconductor integrated circuit device according to claim 99, wherein said groove is formed in said semiconductor substrate and defines said first dummy region and second dummy regions such that a width of said first dummy region is greater than a width of each of said second dummy regions; wherein said second dummy regions are located at said scribing area and are spaced from one another by a predetermined spacing.

102. A semiconductor integrated circuit device according to claim 101, wherein said conductor pattern is formed with the same level layer as a gate electrode of a MISFET.

103. A semiconductor integrated circuit device according to claim 101, wherein said second dummy regions each have a line-shaped pattern.

104. A semiconductor integrated circuit device according to claim 101, further comprising:
dummy conductor patterns formed with the same level layer as said conductor patterns, located at said scribing area and spaced from one another by a predetermined spacing.

105. A semiconductor integrated circuit device according to claim 104, wherein edge portions of said dummy conductor patterns extend over said second dummy regions.

106. A semiconductor integrated circuit device according to claim 104, wherein edge portions of said dummy conductor patterns are shifted from edge portions of said second dummy regions.

107. A semiconductor integrated circuit device according to claim 104, wherein said dummy conductor patterns each have a line-shaped pattern.

108. A semiconductor integrated circuit device according to claim 99, wherein said groove is formed in said semiconductor substrate and defines said first dummy region and second dummy regions such that a width of said first dummy region is greater than a width of each of said second dummy regions, wherein said second dummy regions are located at said scribing area.

109. A semiconductor integrated circuit device comprising:
grooves formed in a semiconductor substrate and defining a first dummy region;
element isolation insulating films filled in said grooves such that said element isolation insulating films serve as an element isolation region; and
a conductor pattern formed over said first dummy region and used for optical pattern recognition,
wherein an area of said dummy region is larger than an area of said conductor pattern,
wherein said dummy region is formed at said scribing area.

110. A semiconductor integrated circuit device according to claim 109, wherein said conductor pattern is formed with the same level layer as a gate electrode of a MISFET.

111. A semiconductor integrated circuit device according to claim 109, wherein said grooves are formed in said semiconductor substrate and define said first dummy region and second dummy regions such that a width of said first dummy region is greater than a width of each of said second dummy regions; wherein said second dummy regions are located at said scribing area and are spaced from one another by a predetermined spacing.

112. A semiconductor integrated circuit device according to claim 111, wherein said conductor pattern is formed with the same level layer as a gate electrode of a MISFET.

113. A semiconductor integrated circuit device according to claim 111, wherein said second dummy regions each have a line-shaped pattern.

114. A semiconductor integrated circuit device according to claim 111, further comprising:
dummy conductor patterns formed with the same level layer as said conductor pattern, located at said scribing area and spaced from one another by a predetermined spacing.

115. A semiconductor integrated circuit device according to claim 114, wherein edge portions of said dummy conductor patterns extend over said second dummy regions.

116. A semiconductor integrated circuit device according to claim 114, wherein edge portions of said dummy conductor patterns are shifted from edge portions of said second dummy regions.

117. A semiconductor integrated circuit device according to claim 114, wherein said dummy conductor patterns each have a line-shaped pattern.

118. A semiconductor integrated circuit device according to claim 109, wherein said grooves are formed in said semiconductor substrate and define said first dummy region and second dummy regions such that a width of said first dummy region is greater than a width of each of said second dummy regions, wherein said second dummy regions are located at said scribing area.

119. A semiconductor integrated circuit device comprising:
a groove formed in a semiconductor substrate and defining a first dummy region;
an element isolation insulating film filled in said groove such that said element isolation insulating film serves as an element isolation region; and
a conductor pattern formed over said first dummy region and used for optical pattern recognition,
wherein an area of said first dummy region is larger than that of said conductor pattern such that the whole area of said conductor pattern is arranged over said first dummy region, and
wherein said first dummy region is formed at a scribing area.

120. A semiconductor integrated circuit device according to claim 119, wherein said conductor pattern is formed with the same level layer as a gate electrode of a MISFET.

121. A semiconductor integrated circuit device according to claim 119, wherein said groove is formed in said semiconductor substrate and defines said first dummy region and second dummy regions such that a width of said first dummy region is greater than a width of each of said second dummy regions; wherein said second dummy regions are located at said scribing area and are spaced from one another by a predetermined spacing.

122. A semiconductor integrated circuit device according to claim 121, wherein said conductor pattern is formed with the same level layer as a gate electrode of a MISFET.

123. A semiconductor integrated circuit device according to claim 121, wherein said second dummy regions each have a line-shaped pattern.

124. A semiconductor integrated circuit device according to claim 121, further comprising:
dummy conductor patterns formed with the same level layer as said conductor patterns, located at said scribing area and spaced from one another by a predetermined spacing.

125. A semiconductor integrated circuit device according to claim 124, wherein edge portions of said dummy conductor patterns extend over said second dummy regions.

126. A semiconductor integrated circuit device according to claim 124, wherein edge portions of said dummy conductor patterns are shifted from edge portions of said second dummy regions.

127. A semiconductor integrated circuit device according to claim 124, wherein said dummy conductor patterns each have a line-shaped pattern.

128. A semiconductor integrated circuit device according to claim 119, wherein said groove is formed in said semiconductor substrate and defines said first dummy region and second dummy regions such that a width of said first dummy region is greater than a width of each of said second dummy regions, wherein said second dummy regions are located at said scribing area.

129. A semiconductor integrated circuit device comprising:
grooves formed in a semiconductor substrate and defining a first dummy region;
element isolation insulating films filled in said grooves such that said element isolation insulating films serve as an element isolation region; and
a conductor pattern formed over said first dummy region and used for optical pattern recognition,
wherein an area of said first dummy region is larger than that of said conductor pattern such that the whole are of said conductor pattern is arranged over said first dummy region, and
wherein said first dummy region is formed at a scribing area.

130. A semiconductor integrated circuit device according to claim 129, wherein said conductor pattern is formed with the same level layer as a gate electrode of a MISFET.

131. A semiconductor integrated circuit device according to claim 129, wherein said grooves are formed in said semiconductor substrate and define said first dummy region and second dummy regions such that a width of said first dummy region is greater than a width of each of said second dummy regions; wherein said second dummy regions are located at said scribing area and are spaced from one another by a predetermined spacing.

132. A semiconductor integrated circuit device according to claim 131, wherein said conductor pattern is formed with the same level layer as a gate electrode of a MISFET.

133. A semiconductor integrated circuit device according to claim 131, wherein said second dummy regions each have a line-shaped pattern.

134. A semiconductor integrated circuit device according to claim 131, further comprising:
dummy conductor patterns formed with the same level layer as said conductor pattern, located at said scribing area and spaced from one another by a predetermined spacing.

135. A semiconductor integrated circuit device according to claim 134, wherein edge portions of said dummy conductor patterns extend over said second dummy regions.

136. A semiconductor integrated circuit device according to claim 134, wherein edge portions of said dummy conductor patterns are shifted from edge portions of said second dummy regions.

137. A semiconductor integrated circuit device according to claim 134, wherein said dummy conductor patterns each have a line-shaped pattern.

138. A semiconductor integrated circuit device according to claim 64, wherein said conductor pattern is formed with the same level layer as a gate electrode of a MISFET.

139. A semiconductor integrated circuit device according to claim 64, wherein said second dummy regions each have a line-shaped pattern.

140. A semiconductor integrated circuit device according to claim 64, further comprising:
dummy conductor patterns formed with the same level layer as said conductor pattern, located at said scribing area and spaced from one another by a predetermined spacing.

141. A semiconductor integrated circuit device according to claim 140, wherein edge portions of said dummy conductor patterns extend over said second dummy regions.

142. A semiconductor integrated circuit device according to claim 140, wherein edge portions of said dummy conductor patterns are shifted from edge portions of said second dummy regions.

143. A semiconductor integrated circuit device according to claim 140, wherein said dummy conductor patterns each have a line-shaped pattern.

144. A semiconductor integrated circuit device according to claim 135, wherein said grooves are formed in said semiconductor substrate and define said first dummy region and second dummy regions such that a width of said first dummy region is greater than a width of each of said second dummy regions, wherein said second dummy regions are located at said scribing area.

* * * * *